US009405337B2

(12) United States Patent
Kim et al.

(10) Patent No.: US 9,405,337 B2
(45) Date of Patent: Aug. 2, 2016

(54) TEMPERATURE MANAGEMENT CIRCUIT, SYSTEM ON CHIP INCLUDING THE SAME AND METHOD OF MANAGING TEMPERATURE

(71) Applicant: SAMSUNG ELECTRONICS CO., LTD., Suwon-Si (KR)

(72) Inventors: Ji Hyung Kim, Hwaseong-Si (KR); Sang Wook Park, Hwaseong-Si (KR); Chong Kun Lee, Hwaseong-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 650 days.

(21) Appl. No.: 13/656,383

(22) Filed: Oct. 19, 2012

(65) Prior Publication Data
US 2013/0169347 A1 Jul. 4, 2013

(30) Foreign Application Priority Data

Jan. 4, 2012 (KR) ........................ 10-2012-0001139

(51) Int. Cl.
*G01K 7/00* (2006.01)
*G06F 1/20* (2006.01)
*G05D 23/19* (2006.01)
*H01L 23/34* (2006.01)

(52) U.S. Cl.
CPC ............ *G06F 1/206* (2013.01); *G05D 23/1932* (2013.01); *H01L 23/34* (2013.01); *H01L 23/345* (2013.01); *H01L 2924/0002* (2013.01)

(58) Field of Classification Search
None
See application file for complete search history.

(56) References Cited

U.S. PATENT DOCUMENTS

| 5,873,053 | A | * | 2/1999 | Pricer et al. ................... 702/130 |
| 6,091,255 | A | * | 7/2000 | Godfrey ................... 324/750.06 |
| 6,172,611 | B1 | | 1/2001 | Hussain et al. |
| 6,412,977 | B1 | * | 7/2002 | Black ..................... G01K 1/024 323/315 |
| 6,735,499 | B2 | * | 5/2004 | Ohki et al. .................... 700/299 |
| 6,789,037 | B2 | * | 9/2004 | Gunther et al. ............... 702/132 |
| 7,150,561 | B1 | * | 12/2006 | D'Aquino ............. G01K 7/015 327/512 |
| 7,520,669 | B2 | | 4/2009 | Yazawa et al. |
| 7,831,842 | B2 | | 11/2010 | Adachi et al. |
| 8,355,288 | B2 | | 1/2013 | Kim et al. |
| 8,423,832 | B2 | * | 4/2013 | Riedlinger et al. ............. 714/37 |

(Continued)

FOREIGN PATENT DOCUMENTS

| CN | 101079316 | 11/2007 |
| KR | 10-0652422 | 11/2006 |

(Continued)

OTHER PUBLICATIONS

English Abstract for Publication No. 10-0652422.

(Continued)

*Primary Examiner* — Mirellys Jagan
(74) *Attorney, Agent, or Firm* — F. Chau & Associates, LLC

(57) ABSTRACT

In managing temperature in a system on chip (SOC), a main temperature signal is generated using a main sensor, where the main temperature signal is a signal having a value corresponding to a main temperature of the SOC. Subsidiary temperature signals are generated using subsidiary sensors, where the subsidiary temperature signals are pulse signals having frequencies corresponding to subsidiary temperatures of subsidiary blocks in the SOC, respectively. An operation of the SOC is controlled based upon the main temperature signal and the subsidiary temperature signals.

10 Claims, 24 Drawing Sheets

(56) References Cited

U.S. PATENT DOCUMENTS

| | | | |
|---|---|---|---|
| 2002/0147932 A1* | 10/2002 | Brock | G06F 1/3203 713/300 |
| 2004/0008754 A1* | 1/2004 | Clabes | H03K 3/0231 374/183 |
| 2004/0024561 A1* | 2/2004 | Huckaby et al. | 702/132 |
| 2004/0136436 A1* | 7/2004 | Ainspan et al. | 374/143 |
| 2004/0193383 A1* | 9/2004 | Clabes | G01K 3/005 702/132 |
| 2004/0195674 A1 | 10/2004 | Gunther et al. | |
| 2005/0114061 A1* | 5/2005 | Gauthier | G01K 15/00 702/99 |
| 2006/0005097 A1 | 1/2006 | Ichikawa et al. | |
| 2006/0013281 A1 | 1/2006 | Sri-Jayantha et al. | |
| 2006/0238267 A1* | 10/2006 | Bienek | G01K 7/42 331/176 |
| 2006/0280012 A1 | 12/2006 | Perner | |
| 2007/0098041 A1 | 5/2007 | Seo | |
| 2007/0213882 A1 | 9/2007 | Inukai et al. | |
| 2007/0239319 A1 | 10/2007 | Inukai et al. | |
| 2007/0290702 A1 | 12/2007 | Lee | |
| 2008/0022140 A1 | 1/2008 | Yamada et al. | |
| 2008/0106321 A1 | 5/2008 | Jeong et al. | |
| 2008/0163226 A1 | 7/2008 | Radhakrisnan et al. | |
| 2008/0267258 A1* | 10/2008 | Hokenmaier | 374/166 |
| 2008/0291969 A1 | 11/2008 | Chu | |
| 2009/0021314 A1* | 1/2009 | Boerstler et al. | 331/66 |
| 2010/0141329 A1 | 6/2010 | Kim | |
| 2010/0213919 A1 | 8/2010 | Takayanagi et al. | |
| 2011/0191776 A1 | 8/2011 | Bose et al. | |
| 2013/0166095 A1* | 6/2013 | Hadderman | G05D 23/1919 700/300 |

FOREIGN PATENT DOCUMENTS

| | | |
|---|---|---|
| KR | 10-0854463 | 8/2008 |
| KR | 10-2010-0066092 | 6/2010 |

OTHER PUBLICATIONS

English Abstract for Publication No. 10-0854463.
English Abstract for Publication No. 10-2010-0066092.
Chinese Office Action Dated May 25, 2016.

* cited by examiner

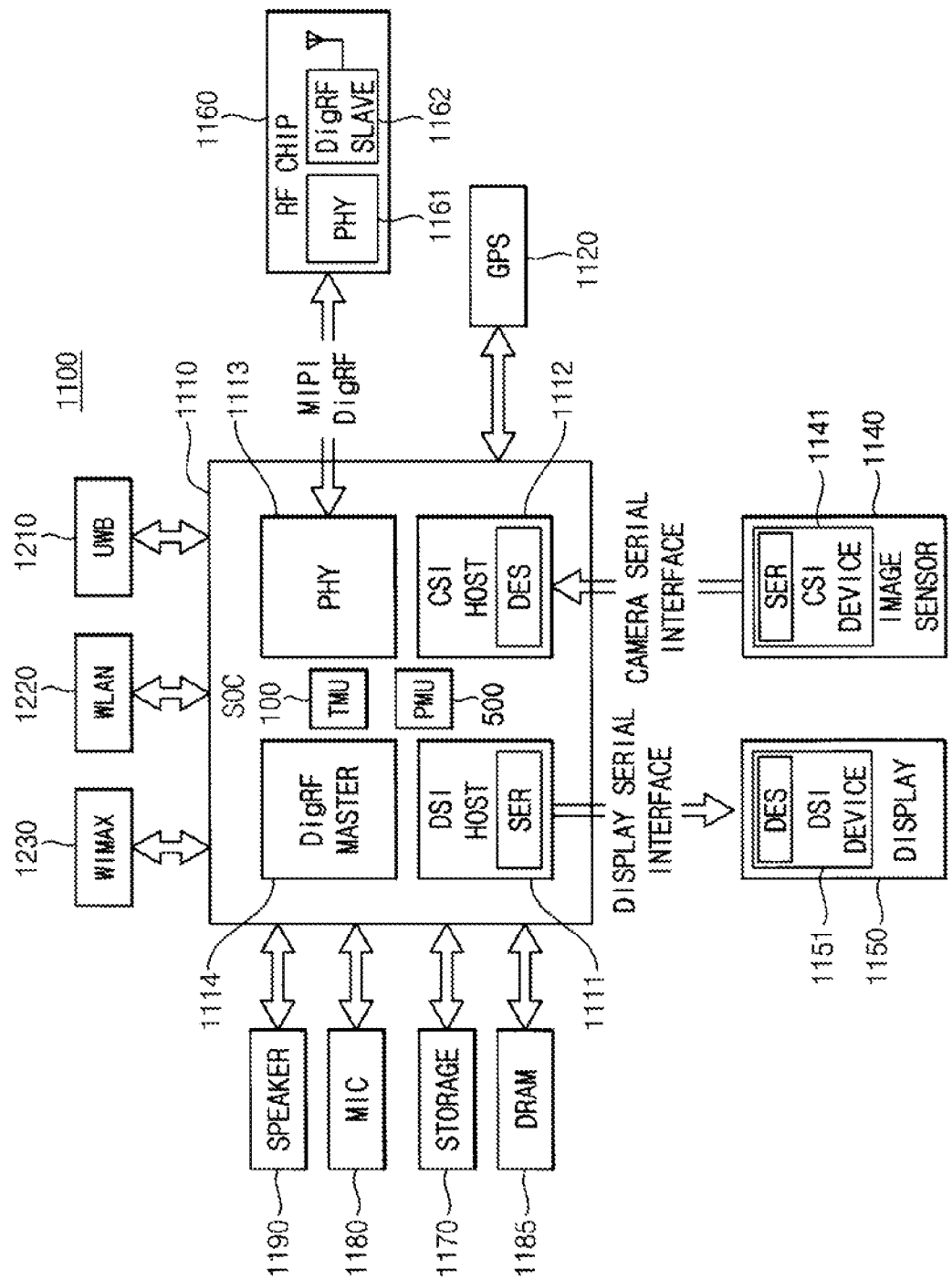

TEMPERATURE MANAGEMENT CIRCUIT, SYSTEM ON CHIP INCLUDING THE SAME AND METHOD OF MANAGING TEMPERATURE

CROSS-REFERENCE TO RELATED APPLICATION

This application claims under 35 USC §119 priority to and the benefit of Korean Patent Application No. 10-2012-0001139, filed on Jan. 4, 2012, in the Korean Intellectual Property Office (KIPO), the entire contents of which are incorporated by reference herein.

BACKGROUND

1. Technical Field

The present disclosure relates to semiconductor integrated circuits, and, more particularly, to a temperature management circuit, a system on chip (SOC) including the temperature management circuit and a method of managing temperature in the SOC.

2. Discussion of the Related Art

An SOC represents a chip or a system integrated in the chip. Recently, various circuits are integrated together in a chip according to an increasing degree of integration of the SOC, and also the operational speed of the SOC is ever-increasing to satisfy user demand. As the integration degree and the operational speed of the SOC increase, temperature/thermal management becomes an important factor in the monitoring and controlling of temperature variation of the SOC.

SUMMARY

Exemplary embodiments in accordance with the present inventive concept provide a method of managing temperature, to efficiently monitor and control temperature variation in a system on chip.

Exemplary embodiments according to present inventive concept provide a temperature management circuit and a system on chip including the temperature management circuit, to efficiently monitor and control temperature variation in the system on chip.

In a method of managing temperature in a system on chip (SOC), a main temperature signal is generated using a main sensor, where the main temperature signal is a signal having a value corresponding to a main temperature of the SOC. Subsidiary temperature signals are generated using subsidiary sensors, where the subsidiary temperature signals are pulse signals having frequencies corresponding to subsidiary temperatures of subsidiary blocks in the SOC, respectively. An operation of the SOC is controlled based upon the main temperature signal and the subsidiary temperature signals.

The main sensor and the subsidiary sensors may be on-chip sensors that are integrated at a same semiconductor substrate at which the SOC is integrated.

A variation of the main temperature may be detected based upon the main temperature signal and at least one temperature threshold value, and at least one of the overall operations of the SOC and respective operations of the subsidiary blocks may be controlled based upon the subsidiary temperature signals and the detected variation of the main temperature.

The main temperature signal may be latched periodically to store a previous main temperature value and a current main temperature value, and pulses of the subsidiary temperature signals may be counted periodically to store current subsidiary temperature count values.

An interrupt signal may be generated based upon at least one temperature threshold value, the previous main temperature value and the current main temperature value, and respective operational speeds of the subsidiary blocks may be controlled based upon the interrupt signal and the current subsidiary temperature count values.

The respective operational speeds of the subsidiary blocks may be controlled by varying at least one of power supply voltages and operational frequencies of the subsidiary blocks.

The respective operational speeds of the subsidiary blocks may be controlled by comparing the current subsidiary temperature count values in response to the interrupt signal, and by controlling the respective operational speeds of the subsidiary blocks based upon the comparison result of the current subsidiary temperature count values.

The operational speed of the subsidiary block corresponding to the higher current subsidiary temperature count value may be decreased when the interrupt signal indicates an increase of the main temperature, and the operational speed of the subsidiary block corresponding to the lower current subsidiary temperature count value may be increased when the interrupt signal indicates a decrease of the main temperature.

The respective operational speeds of the subsidiary blocks may be controlled by calculating a distribution value of the current subsidiary temperature count values in response to the interrupt signal, and by controlling the respective operational speeds of the subsidiary blocks based upon the distribution value of the current subsidiary temperature count values.

The interrupt signal may be generated by activating a temperature rising interrupt signal when the previous main temperature value is smaller than a temperature rising threshold value and the current main temperature value is greater than the temperature rising threshold value, and by activating a temperature falling interrupt signal when the previous main temperature value is greater than a temperature falling threshold value and the current main temperature value is smaller than the temperature falling threshold value.

The temperature falling threshold value may be smaller than the temperature rising threshold value.

The operation of the SOC may be controlled by comparing the current main temperature value and a maximum temperature threshold value, and by blocking an external power supply voltage provided to the SOC when the current main temperature value is greater than the maximum temperature threshold value.

Cycles of a reference clock signal may be counted periodically to store a current reference count value, where the reference clock signal has a reference frequency independent of temperature. Current subsidiary temperature frequencies may be calculated based upon the current subsidiary temperature count values, the current reference count value and the reference frequency, where each of the current subsidiary temperature frequencies is proportional to each of the subsidiary temperatures. Current subsidiary temperature values of the subsidiary blocks may be calculated based upon the current subsidiary temperature frequencies.

A reference pulse signal may be generated using an additional subsidiary sensor that is disposed near the main sensor, where the reference pulse signal has a frequency corresponding to the main temperature. Pulses of the reference pulse signal may be counted periodically to store a current reference count value. Current subsidiary temperature values of the subsidiary blocks may be calculated based upon the current subsidiary temperature count values, the current main temperature value and the current reference count value.

According to an exemplary embodiment, a system on chip (SOC) includes a plurality of subsidiary blocks, a processor, a power management unit, a main sensor, a plurality of subsidiary sensors and a temperature management unit. The subsidiary blocks are divided by own functions thereof, and the subsidiary blocks are heat sources of the SOC. The processor generates a temperature management signal based upon temperature information. The power management unit controls at least one of power supply voltages and operational frequencies of the SOC based upon the temperature management information. The main sensor generates a main temperature signal, where the main temperature signal is a signal having a value corresponding to a main temperature of the SOC. The subsidiary sensors generate subsidiary temperature signals, where the subsidiary temperature signals being pulse signals have frequencies corresponding to subsidiary temperatures of subsidiary blocks in the SOC, respectively. The temperature management unit provides the temperature information based upon the main temperature signal and the subsidiary temperature signals.

The temperature management unit may include a temperature sampler, a register unit, an interrupt generator and a sensor controller. The temperature sampler may sample the main temperature signal and the subsidiary temperature signals periodically to provide sampled values. The register unit may store the temperature information and operational information based upon the sampled value and an operation control signal from the processor. The interrupt generator may generate an interrupt signal based upon the temperature information. The sensor controller may control the main sensor and the subsidiary sensors based upon the operational information.

The temperature sampler may include a latch unit configured to latch the main temperature signal periodically to provide a main temperature value, and a plurality of subsidiary temperature counters configured to count pulses of the subsidiary temperature signals periodically to provide subsidiary temperature count values.

The register unit may store a previous main temperature value, a current main temperature value and current subsidiary temperature count values based upon the main temperature value and the subsidiary temperature count values that are provided periodically. The interrupt generator may generate the interrupt signal based upon at least one temperature threshold value, the previous main temperature value and the current main temperature value.

The processor may compare the current subsidiary temperature count values in response to the interrupt signal, and generate the temperature management signal based upon the comparison result of the current subsidiary temperature count values.

The processor may calculate a distribution value of the current subsidiary temperature count values in response to the interrupt signal, and generate the temperature management signal based upon the distribution value of the current subsidiary temperature count values.

The interrupt generator may compare the current main temperature value and a maximum temperature threshold value and generate a tripping signal when the current main temperature value is greater than the maximum temperature threshold value, and the tripping signal may be for blocking an external power supply voltage provided to the SOC.

The temperature sampler may further include a reference counter configured to count cycles of a reference clock signal periodically to provide a reference count value, where the reference clock signal has a reference frequency independent of temperature. The register unit may store a current reference count value based upon the reference count value that is provided periodically. The processor may calculate current subsidiary temperature frequencies based upon the current subsidiary temperature count values, the current reference count value and the reference frequency, and each of the current subsidiary temperature frequencies may be proportional to each of the subsidiary temperatures. The processor may calculate current subsidiary temperature values of the subsidiary blocks based upon the current subsidiary temperature frequencies, and generate the temperature management signal based upon the current subsidiary temperature values.

The SOC may further include an additional subsidiary sensor that may generate a reference pulse signal having a frequency corresponding to the main temperature. The temperature sampler may further include an additional counter configured to count pulses of the reference pulse signal periodically to provide a reference count value. The register unit may store a current reference count value based upon the reference counter value that is provided periodically. The processor may calculate current subsidiary temperature values of the subsidiary blocks based upon the current subsidiary temperature count values, the current main temperature value and the current reference count value, and generate the temperature management signal based upon the current subsidiary temperature values.

The SOC may further include a plurality of heat bridges configured to thermally couple the subsidiary sensors to the main sensor, and the heat bridges may have a heat conductivity higher than a heat conductivity of a semiconductor substrate at which the SOC is integrated.

According to an exemplary embodiment, a temperature management circuit of a system on chip (SOC), where the SOC includes a plurality of subsidiary blocks divided by own functions thereof and the subsidiary blocks are heat sources of the SOC, includes a main sensor, a plurality of subsidiary sensors and a temperature management unit. The main sensor generates a main temperature signal, where the main temperature signal is a signal having a value corresponding to a main temperature of the SOC. The subsidiary sensors generate subsidiary temperature signals, where the subsidiary temperature signals are pulse signals having frequencies corresponding to subsidiary temperatures of subsidiary blocks in the SOC, respectively. The temperature management unit provides temperature information of the SOC based upon the main temperature signal and the subsidiary temperature signals.

The main sensor and the subsidiary sensors may be on-chip sensors that are integrated at a same semiconductor substrate at which the SOC is integrated.

Each of the subsidiary sensors has an occupying area smaller than an occupying area of the main sensor.

The main sensor may include a temperature detector configured to output at least one of a voltage signal and a current signal proportional to the main temperature, and an analog-to-digital converter configured to convert the output of the temperature detector to a digital signal to generate the main temperature signal. Each subsidiary sensors may include a ring oscillator having an operational speed proportional to each subsidiary temperature to output each subsidiary temperature signal.

According to an exemplary embodiment a temperature management apparatus for controlling an SOC in response to SOC temperature variations is provided. The temperature management apparatus includes a processor. A temperature management unit is coupled to the processor. A digital temperature sensor is configured to provide a main temperature signal to the temperature management unit based upon temperature monitoring of the overall temperature of the SOC. Subsidiary pulse sensors are configured to provide subsidiary temperature signals to the temperature management unit based upon temperature monitoring of subsidiary functional system blocks of the SOC. The temperature management unit is configured to sample the main temperature signal to determine whether a sampled value of the main temperature signal satisfies an interrupt condition regardless of sampled values of the subsidiary temperature signals, the interrupt condition being set to determine whether a noticeable variation of the overall temperature occurs. When the main temperature signal does not satisfy the interrupt condition, the temperature management unit is configured to sample the main temperature signal and the subsidiary temperature signals to determine whether the interrupt condition is satisfied. The temperature management unit is configured to generate an interrupt signal to the processor when the interrupt condition is satisfied such that the processor can control operations of the SOC.

BRIEF DESCRIPTION OF THE DRAWINGS

Illustrative, non-limiting exemplary embodiments will be more clearly understood from the following detailed description taken in conjunction with the accompanying drawings.

FIG. 31 is a block diagram illustrating an interface employable in the computing system of FIG. 30.

DETAILED DESCRIPTION OF THE EMBODIMENTS

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1:
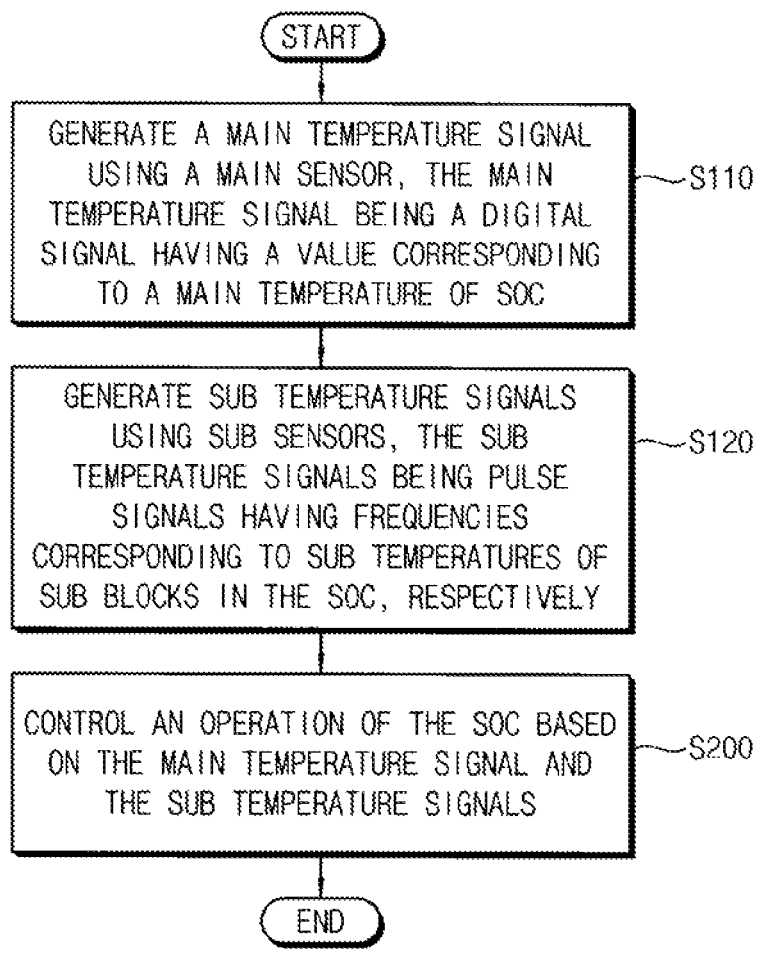
FIG. 1 is a flowchart illustrating a method of managing temperature in an SOC according to an exemplary embodiment.

FIG. 1 is a flowchart illustrating a method of managing temperature in an SOC according to an exemplary embodiment.

Referring to FIG. 1, a main temperature signal is generated using a main sensor, where the main temperature signal is a signal having a value corresponding to a main temperature of the SOC (block S110). Subsidiary temperature signals are generated using subsidiary sensors, where the subsidiary temperature signals are pulse signals having frequencies corresponding to subsidiary temperatures of subsidiary blocks in the SOC, respectively (block S120). An operation of the SOC is controlled based upon the main temperature signal and the subsidiary temperature signals (block S200).

In general, a digital temperature sensor for providing a digital signal representing a measured temperature occupies a relatively large area in an integrated circuit. Since the digital temperature sensor requires a large number of interface signals, peripheral circuit have to be routed to avoid the digital temperature sensor. The digital sensor in the integrated circuit typically takes up a large area and necessitates the complex routing, even though the digital sensor provides direct information on temperature. According to an exemplary embodiment, the size of the SOC may be reduced and the limitation to routing may be relieved without degrading the performance of temperature management, by implementing the one main sensor with a digital sensor and the other subsidiary sensors with pulse sensors that require a smaller area and a smaller number of signal lines than the digital sensor.

Figure 2:
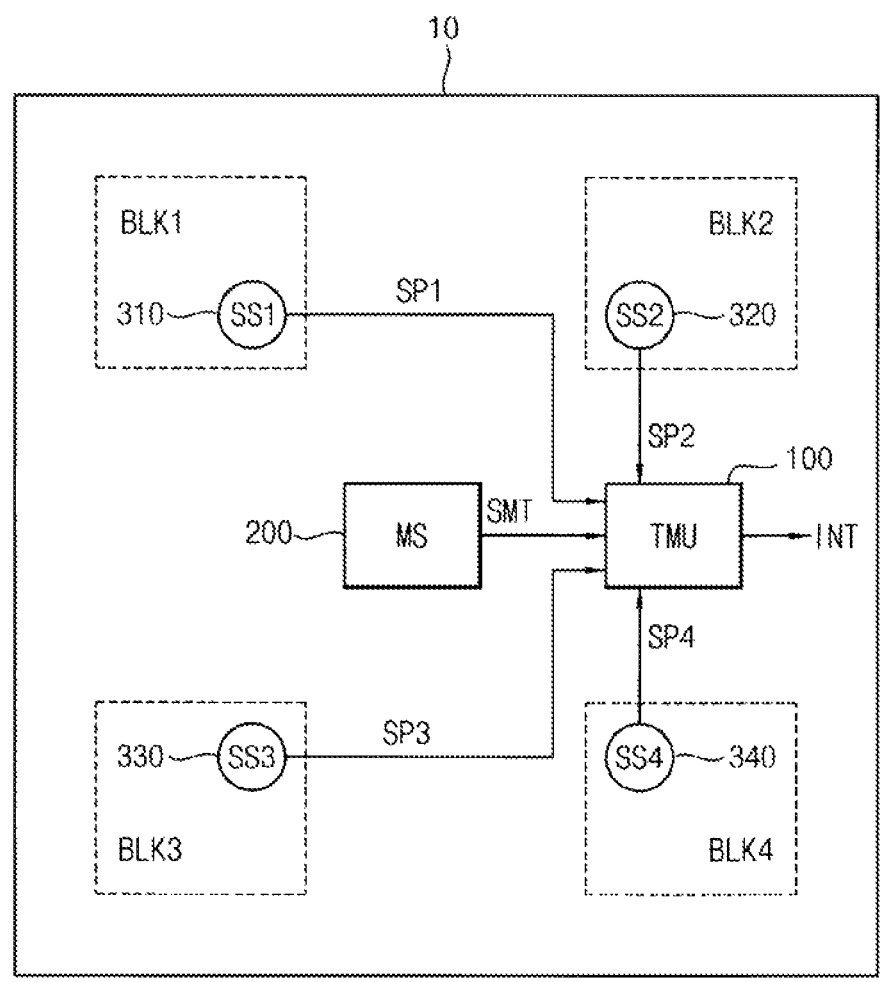
FIG. 2 is a diagram illustrating a layout of a temperature management circuit in an SOC according to an exemplary embodiment.

FIG. 2 is a diagram illustrating a layout of a temperature management circuit in an SOC according to an exemplary embodiment.

Referring to FIG. 2, a temperature management circuit in an SOC 10 includes a temperature management unit (TMU) 100, a main sensor (MS) 200 and a plurality of subsidiary sensors SS1 310, SS2 320, SS3 330, SS4 340. FIG. 2 illustrates the four subsidiary sensors for convenience of description, but the number of the subsidiary sensors may vary according to a configuration of the SOC 10. Other elements in the SOC 10 are omitted except for the temperature management circuit.

The system on chip 10 may include a plurality of subsidiary blocks BLKi (i=1, 2, 3, 4), which may be individualized by their own functions. For example, the subsidiary blocks BLKi may include a core block including a central processing unit, a memory controller, a display controller block, a file system block, a graphic processing unit block, an image signal processing block, a multi-format codec block, and the like. These subsidiary blocks may be significant heat sources of the SOC and monitoring and controlling the respective temperatures of the subsidiary blocks BLKi, in addition to the overall temperature of the SOC 10, becomes needed.

The main sensor 200 generates a main temperature signal SMT, where the main temperature signal SMT is a digital signal having a value corresponding to a main temperature of the SOC 10. That is, the main sensor 200 may be implemented with a digital sensor. The subsidiary sensors 310, 320, 330, 340 generate subsidiary temperature signals SPi (i=1, 2, 3, 4), where the subsidiary temperature signals are pulse signals having frequencies corresponding to subsidiary temperatures of subsidiary blocks BLKi in the SOC 10, respectively. That is, the subsidiary sensors 310, 320, 330, 340 may be implemented with pulse sensors such as ring oscillators. The temperature management unit 100 generates temperature information of the SOC 10 based upon the main temperature signal SMT and the subsidiary temperature signals SPi. As will be described below, the temperature information may be stored in the temperature management unit 100 and may be provided to a processor in the SOC 10. The temperature management unit 100 may generate an interrupt signal INT based upon the stored temperature information, and the processor may perform an interrupt service routine (ISR) in response to the interrupt signal INT to analyze the temperature information and control the operation of the SOC.

The main sensor 200 and the subsidiary sensors 310, 320, 330, 340 may be on-chip sensors that are integrated at a same semiconductor substrate at which the SOC 10 is integrated. The on-chip sensors may generate output signals exactly reflecting the temperatures to be measured and may reduce the size of the SOC 10. The subsidiary sensors 310, 320, 330, 340 may be integrated in the subsidiary blocks BLKi.

The main sensor 200 may be integrated at a proper position for exactly reflecting the overall temperature of the SOC 10. For example, the main sensor 200 may be disposed at the position so that the deviation of distances from the main sensor 200 to the subsidiary sensors 310, 320, 330, 340 may be minimized. When heat conductivity of intervening materials between the main sensor 200 and the subsidiary sensors 310, 320, 330, 340 are different, the position of the main sensor 200 may be determined considering the heat conductivity. When the SOC includes a heat spreader for heat emission of the SOC, the main sensor 200 may be disposed near the heat spreader.

Figure 3:
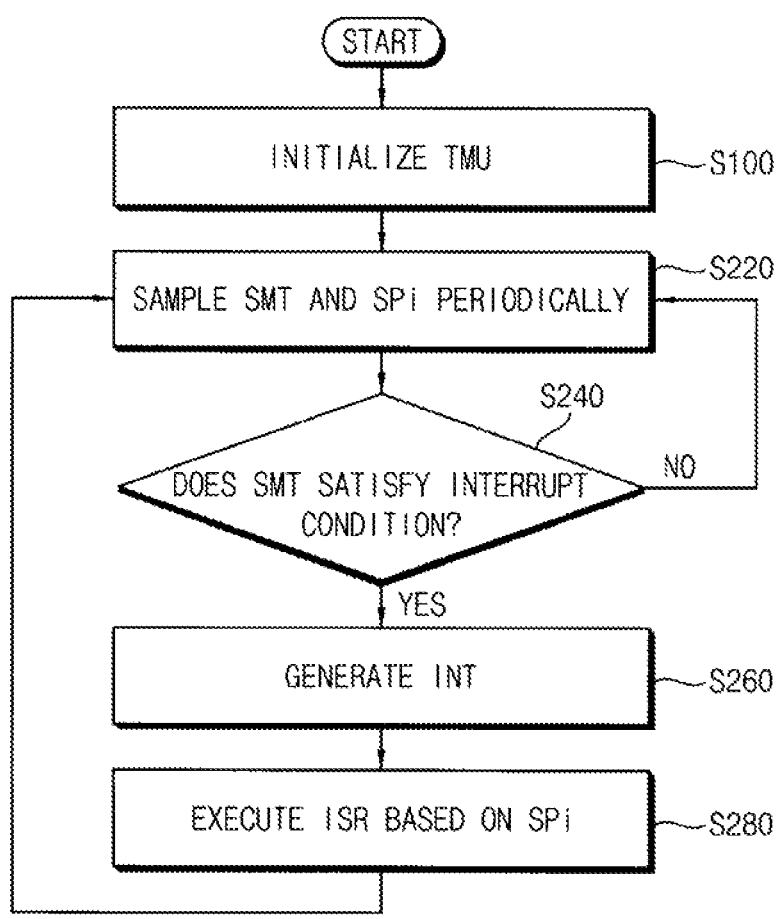
FIG. 3 is a flowchart illustrating a method of managing temperature in an SOC according to an exemplary embodiment.

FIG. 3 is a flowchart illustrating a method of managing temperature in an SOC according to an exemplary embodiment.

Referring to FIGS. 2 and 3, the temperature management unit TMU may be initialized (block S100), for example, by setting the temperature management unit TMU in an enable state in response to a control signal from a processor in the SOC and storing operational information in the temperature management unit TMU. When the temperature management unit TMU is initialized, the main sensor MS and the subsidiary sensors SSi are enabled to generate the main temperature signal SMT and the subsidiary temperature signals SPi.

The temperature management unit TMU may sample the main temperature signal SMT and subsidiary temperature signals SPi periodically (block S220). The temperature management unit TMU may determine whether the sampled value of the main temperature signal SMT satisfies an interrupt condition (block S240) regardless of the sampled values of the subsidiary temperature signals SSi. The interrupt condition may be set to determine whether a noticeable variation of the main temperature occurs.

When the main temperature signal SMT does not satisfy the interrupt condition (block S240: NO), the temperature management unit TMU may sample the main temperature signal SMT and the subsidiary temperature signals (block S220) of the next sampling period to determine whether the next sampled value of the main temperature signal SMT satisfies the interrupt condition (block S240).

When the main temperature signal SMT satisfies the interrupt condition (block S240: YES), the temperature management unit TMU may generate the interrupt signal INT (block S260). The generation of a signal may represent the activation of the signal, that is, the transition of the signal from a deactivated level to a active level. When the interrupt signal INT is generated, an interrupt service routine ISR may be executed based upon the sampled values of the subsidiary temperature signals SPi (block S280). The interrupt service routine ISR may be implemented as software, hardware or combination thereof for analyzing the temperature distribution of the subsidiary blocks BLKi to take proper steps. For example, the interrupt service routine ISR may be a program executed by the processor in the SOC.

As such, the main temperature of the SOC may be monitored to generate the interrupt signal INT based upon the main temperature signal SMT regardless of the subsidiary temperature signals SPi, the subsidiary temperature signals SPi being considered only when the interrupt signal INT is generated, and thus efficient and prompt temperature management may be performed.

The interrupt service routine ISR may be executed based upon the sampled values of the subsidiary temperature signals SPi as follows.

In some exemplary embodiments as will be described below, current subsidiary temperature count values CNTi_C, which are sampled values of the subsidiary temperature signals SPi, may be compared in response to the interrupt signal INT, and respective operational speeds of the subsidiary blocks BLKi may be controlled based upon the comparison result of the current subsidiary temperature count values CNTi_C. The operational speed of the subsidiary block BLKi corresponding to the higher current subsidiary temperature count value CNTi_C may be primarily decreased when the interrupt signal INT indicates an increase of the main temperature, and the operational speed of the subsidiary block BLKi corresponding to the lower current subsidiary temperature count value CNTi_C may be primarily increased when the interrupt signal INT indicates a decrease of the main temperature.

For example, a power supply voltage and/or an operational frequency of the subsidiary block corresponding to the maximum subsidiary temperature count value may be decreased in case of a temperature rising event, and a power supply voltage and/or an operational frequency of the subsidiary block corresponding to the minimum subsidiary temperature count value may be increased in case of a temperature falling event.

In an exemplary embodiment, a distribution value of the current subsidiary temperature count values CNTi_C may be calculated in response to the interrupt signal INT, and the respective operational speeds of the subsidiary blocks BLKi may be controlled based upon the distribution value of the current subsidiary temperature count values CNTi_C. The distribution value may include a mean value M and a standard deviation SD of the current subsidiary temperature count values CNTi_C.

For example, a power supply voltage and/or an operational frequency of the subsidiary block corresponding to the current subsidiary temperature count values CNTi_C greater than $M+a1*SD$ may be decreased in case of a temperature rising event, and a power supply voltage and/or an operational frequency of the subsidiary block corresponding to the current subsidiary temperature count values CNTi_C smaller than $M-a2*SD$ may be increased in case of a temperature falling event. Here, a1 and a2 are constants that may be determined through experiments under real operational conditions after the SOC 10 which includes the temperature management circuit, is integrated.

Figure 4:
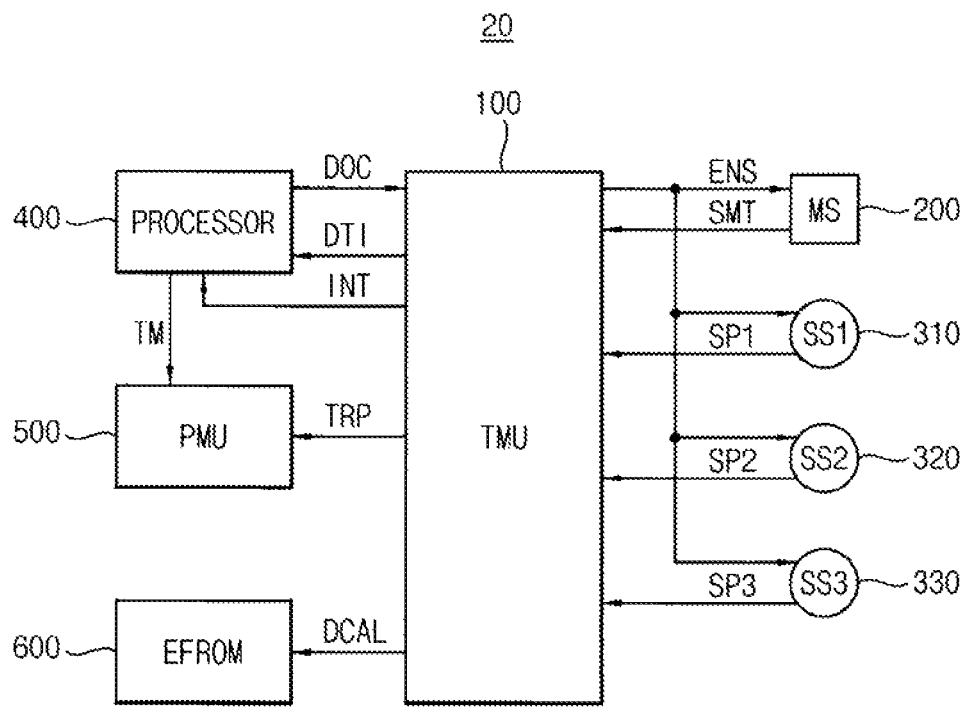
FIG. 4 is a block diagram illustrating an SOC according to an exemplary embodiment.

FIG. 4 is a block diagram illustrating an SOC according to an exemplary embodiment.

Referring to FIG. 4, an SOC 20 may include a temperature management unit (TMU) 100, a main sensor (MS) 200, a plurality of subsidiary sensors SS1 310, SS2 320, SS3 330, a processor 400 and a power management unit (PMU) 500. FIG. 4 illustrates the three subsidiary sensors for convenience of description, but the number of the subsidiary sensors may vary according to a configuration of the SOC 20.

The processor 400 may generate a temperature management signal TM based upon an interrupt signal INT and temperature information DTI to control the operation of the SOC 20. As will be described with reference to FIG. 8, the temperature information DTI may include current subsidiary temperature count values CNTi_C, a current main temperature value MT_C and/or a previous main temperature value MT_P.

The power management unit 500 may control at least one of power supply voltages and operational frequencies of the SOC 20 based upon the temperature management signal TM.

The power management unit 500 may include an internal voltage regulator and/or an internal clock generator or may generate signals to control an external voltage regulator and/or an external clock generator.

As described above, the main sensor 200 generates the main temperature signal SMT, which is a digital signal having a value corresponding to a main temperature of the SOC 20. The subsidiary sensors 310, 320, 330 generate subsidiary temperature signals SPi (i=1, 2, 3), which are pulse signals having frequencies corresponding to subsidiary temperatures of subsidiary blocks in the SOC 20, respectively.

The temperature management unit 100 may provide the temperature information DTI and the interrupt signal INT based upon the main temperature signal SMT and the subsidiary temperature signals SPi. The temperature management unit 100 may be initialized and controlled based upon an operational control signal DOC from the processor 400. In an exemplary embodiment, the temperature management unit 100 may generate a tripping signal TRP when a particular condition is satisfied, and the power management unit 500 may block an external power supply voltage provided to the SOC 20.

FIG. 4 illustrates an embodiment that the interrupt signal INT is provided directly from the temperature management unit 100, but the SOC may further include an interrupt controller that receives the interrupt signal INT. The interrupt controller may control other interrupts including the interrupt from the temperature management unit 100 and may transfer the selected interrupt to the processor 400 depending upon priorities of the interrupts.

Even though not illustrated in FIG. 4, the temperature management unit 100 may receive a reference clock signal RCLK as will be described with reference to FIGS. 21, 22 and 23. In an exemplary embodiment, the SOC 20 may further include an additional subsidiary sensor AS disposed near the main sensor MS as will be described with reference to FIGS. 24, 25, 26 and 27, and the temperature management unit 100 may receive a reference pulse signal SRP from the additional subsidiary sensor AS.

The SOC 20 may further include an electrical fuse read only memory (EFROM) 600. After the SOC is integrated, calibration information for correcting errors in real temperature measurement may be obtained through test operations and the calibration information may be stored in the EFROM 600. For example, temperature threshold values for detecting the variation of temperature as will be described below may be corrected based upon the stored calibration information.

Figure 5:
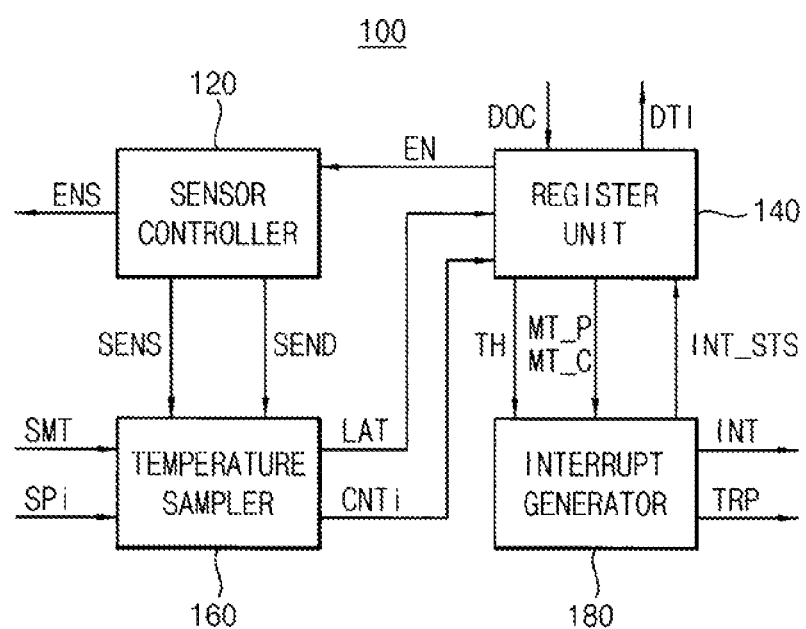
FIG. 5 is a block diagram illustrating a temperature management unit in a temperature management circuit according to an exemplary embodiment.

FIG. 5 is a block diagram illustrating a temperature management unit in a temperature management circuit according to an exemplary embodiment.

Referring to FIG. 5, a temperature management unit 100 may include a sensor controller 120, a register unit 140, a temperature sampler 160 and an interrupt generator 180.

The temperature sampler 120 may sample the main temperature signal SMT and the subsidiary temperature signals SPi periodically to provide sampled values LAT, CNTi. For example, the sampled values LAT, CNTi may be provided per sensing period or sampling period that may correspond to a time interval between activation timings of a sensing-start signal SENS and a sensing-done signal SEND provided from the sensor controller 120.

The register unit 140 may store the temperature information DTI and operational information based upon the operational control signal DOC from the processor 400 and the sampled values LAT, CNTi from the temperature sampler 160. The temperature information DTI may include the current subsidiary temperature count values CNTi_C, the current main temperature value MT_C and/or the previous main temperature value MT_P as will be described with reference to FIG. 8. When the interrupt signal INT is generated, the processor 400 may receive the temperature information DTI to execute the above-described interrupt service routine ISR.

The operational information stored in the register unit 140 may include an enable status value, an interrupt status value, a sensing period value, at least one temperature threshold value, control values of the main sensor 200 and the subsidiary sensors 310, 320, 330. For example, the activation timings of the sensing-start signal SENS and the sensing-done signal SEND may be determined based upon the sensing period value stored in the register unit 140.

The interrupt generator 180 may generate the interrupt signal INT based upon the temperature information DTI stored in the register unit 140. For example, the interrupt generator 180 may receive at least one temperature threshold value TH, the current main temperature value MT_C and the previous main temperature value MT_P to detect the variation of the main temperature. The interrupt generator 180 may generate the interrupt signal INT when the variation of the main temperature corresponds to the temperature threshold value TH and may store an interrupt status value INT_STS in the register unit 140.

The processor 400 may control at least one of the overall operations of the SOC 20 and the respective operations of the subsidiary blocks BLKi by executing the interrupt service routine ISR based upon the subsidiary temperature signals SPi and the detected variation of the main temperature. For example, the processor 400 may execute the interrupt service routine ISR based upon the interrupt signal INT and the current subsidiary temperature count values CNTi_C.

The sensor controller 120 may control the main sensor 200 and the subsidiary sensors 310, 320, 330 based upon the operational information stored in the register unit 140. For example, the sensor controller 120 may be implemented with a finite state machine (FSM) operating by shifting sequentially the predetermined states.

Operation timings of the FSM may be determined based upon the enable status value stored in the register unit 140. The FSM may be in an idle state normally and may be enabled when the enable value from the processor 400 is stored in an enable status register included in the register unit 140. When the FSM is enabled, the sensing enable signal ENS may be activated to enable the main sensor 200 and the subsidiary sensors 310, 320, 330. The FSM may periodically activate the sensing-start signal SENS and the sensing-done signal SEND by the timings determined based upon the sensing period value stored in the register unit 140. The FSM may be disabled when the disable value from the processor 400 is stored in the enable status register included in the register unit 140 and then the FSM may quit the operation to enter the idle state.

Figure 6:
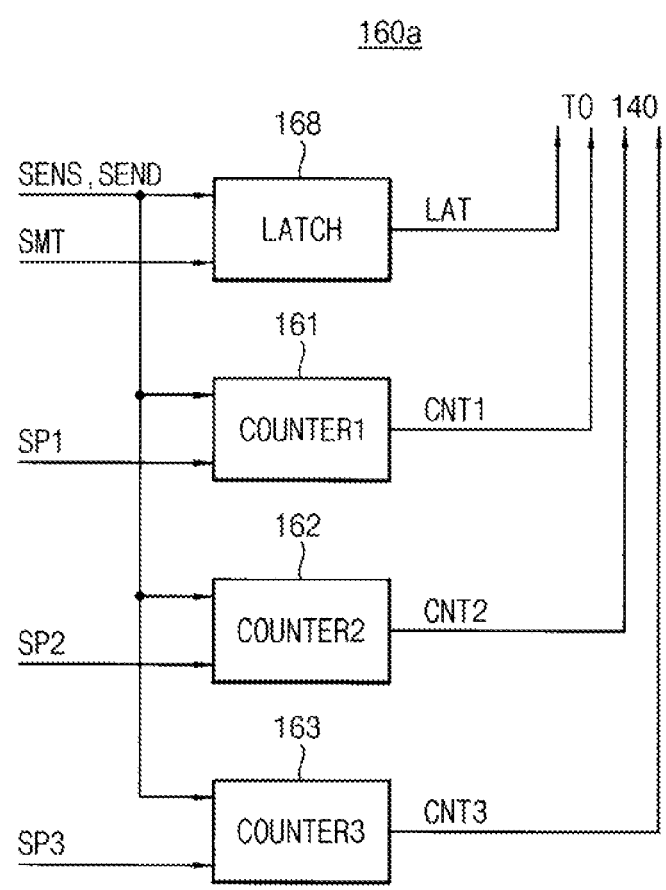
FIG. 6 is a block diagram illustrating an exemplary embodiment of a temperature sampler in the temperature management unit of FIG. 5.

FIG. 6 is a block diagram illustrating an exemplary embodiment of a temperature sampler in the temperature management unit of FIG. 5.

Referring to FIG. 6, a temperature sampler 160*a* may include a latch unit 168 and a plurality of subsidiary temperature counters 161, 162, 163. The latch unit 168 may latch the main temperature signal SMT periodically to provide a main temperature value LAT per sensing period. As described above, the sensing period may be determined based upon the activation timings of the sensing-start signal SENS and the sensing-done signal SEND. The subsidiary temperature counters 161, 162, 163 may count pulses of the subsidiary temperature signals SP1, SP2, SP3 periodically to provide subsidiary temperature count values CNT1, CNT2, CNT3 per sensing period. The main temperature value LAT and the subsidiary temperature count values CNT1, CNT2, CNT3 may be provided to the register unit 140. Storing of the sampled values will be further described with reference to FIG. 8.

FIG. 6 illustrates three subsidiary temperature counters 161, 162, 163 for convenience of description, but the number of the subsidiary temperature counters may vary according to the number of the subsidiary sensors.

Figure 7:
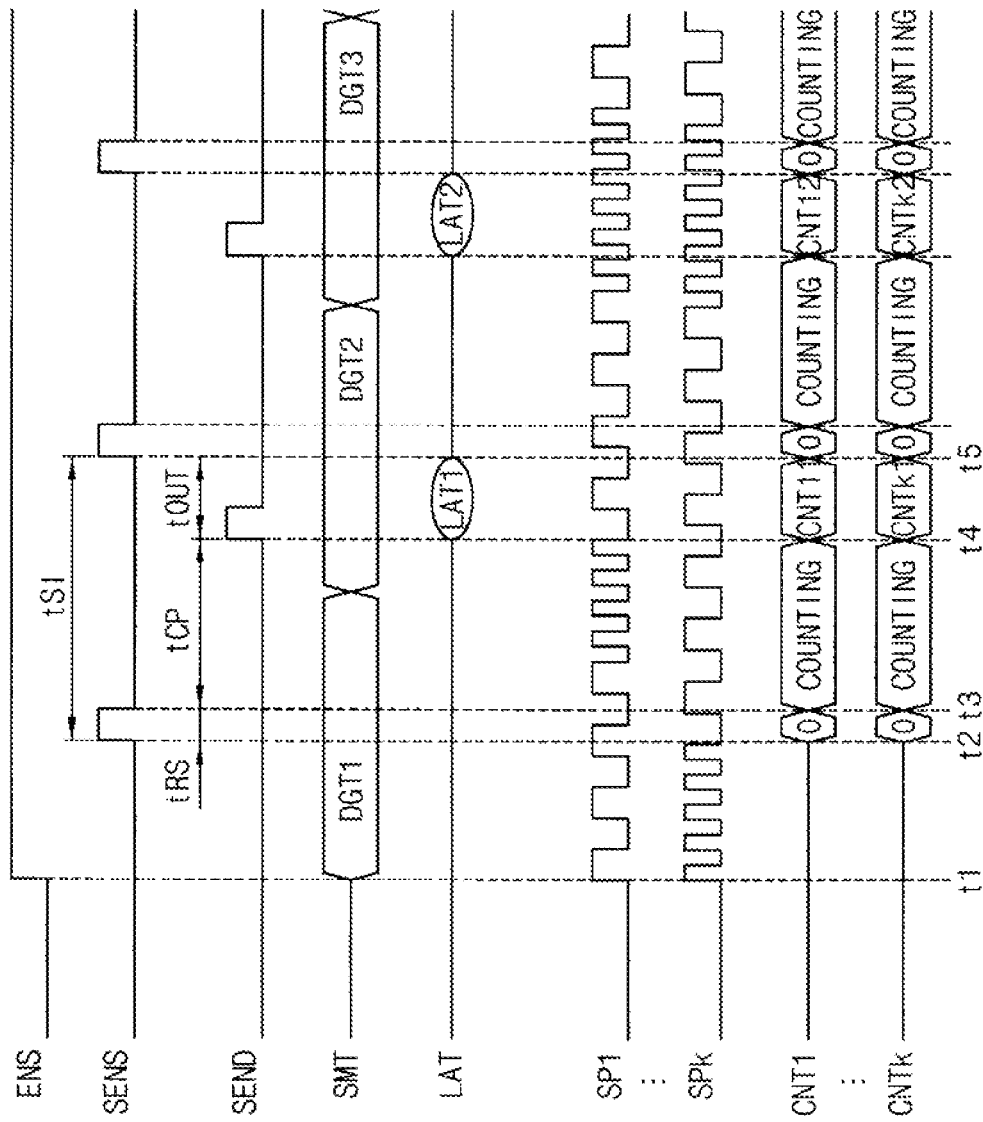
FIG. 7 is a timing diagram illustrating the operation of a temperature management unit according to an exemplary embodiment.

FIG. 7 is a timing diagram illustrating the operation of a temperature management unit according to an exemplary embodiment.

Referring to FIG. 7, the sensing enable signal ENS is activated at time t1 when the temperature management unit TMU is initialized. The main sensor MS and the subsidiary sensors SPi (i=1, 2, . . . , k) begin generating the main temperature signal SMT and the subsidiary temperature signals SPi in response to the sensing enable signal ENS. The main temperature signal SMT represents digital values DGT1, DGT2, DGT3 of the main temperature that are measured periodically. The measurement period of the digital values DGT1, DGT2, DGT3 may be determined according to a configuration of the main sensor MS and/or a control of the sensor controller 120. The subsidiary temperature signals SPi are provided as the pulse signals having the respective frequencies corresponding to the subsidiary temperatures of the subsidiary blocks BLKi.

When the sensing-start signal SENS is activated at time t2, the latch circuit 168 and the subsidiary temperature counters 161, 162, 163 in the temperature sampler 160*a* may be reset. The subsidiary temperature counters 161, 162, 163 may start the counting operation at time t3 after the reset time interval tRS. When the sensing-done signal SEND is activated at time t4 after the counting period tCP, the latch unit 168 may latch the digital value DGT1 of the main temperature signal SMT and the sampled main temperature value LAT1 is provided to the register unit 140. At time t4, the counting operation of the subsidiary temperature counters 161, 162, 163 may be completed and the sampled subsidiary temperature count values CNT11 are provided to the register unit 140.

After the output time interval tOUT, the sensing-start signal SENS is activated again at time t5. Above-mentioned resetting, counting, sampling and outputting operations are repeated and the next main temperature value LAT2 and the next subsidiary temperature count values CNTi2 may be provided to the register unit 140.

As such, the main temperature signal SMT and the subsidiary temperature signals SPi may be sampled per sensing period tSI and the sampled values LAT, CNTi may be provided periodically to the register unit 140.

Figure 8:
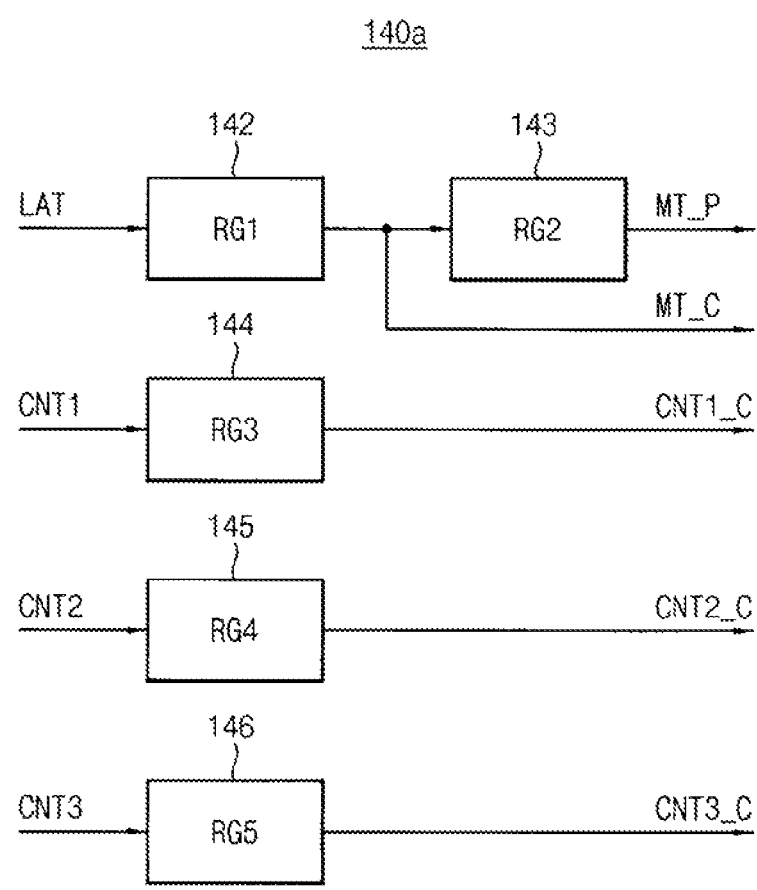
FIG. 8 is a block diagram illustrating an exemplary embodiment of a register unit in the temperature management unit of FIG. 5.

FIG. 8 is a block diagram illustrating an exemplary embodiment of a register unit in the temperature management unit of FIG. 5.

FIG. 8 illustrates registers for storing the temperature information based upon the sampled values LAT, CNT1, CNT2, CNT3. Other registers for storing the operational information, and the like, are omitted.

Referring to FIG. 8, a register unit 140*a* may include a first register RG1 142 and a second register RG2 143 configured to sequentially store the main temperature value LAT that is provided periodically, and a third register RG3 144, a fourth register RG4 145 and a fifth register RG5 146 configured to store the subsidiary temperature count values CNT1, CNT2, CNT3 that are provided periodically.

The value of the second register RG2 may be upgraded with the value of the first register RG1 and the value of the first register RG1 may be upgraded with the newly input main temperature value LAT, per sensing period tSI. For example, the first and second registers RG1, RG2 may be implemented with a shift register to sequentially store the input values provided periodically. The third, fourth and fifth registers may be upgraded with the newly input subsidiary temperature count values CNT1, CNT2, CNT3, per sensing period tSI.

As a result, the first register RG1 may store and output the current main temperature value MT_C, the second register RG2 may store and output the previous main temperature value MT_P, and the third, fourth and fifth registers RG3, RG4, RG5 may store and output the current subsidiary temperature count values CNT1_C, CNT2_C, CNT2_C, respectively.

FIG. 8 illustrates the two registers RG1, RG2 to sequentially store two values. However, more registers may be coupled in series to sequentially store more values. The number of registers to store and output the current subsidiary temperature count values CNTi_C may be changed according to the number of subsidiary sensors.

Even though not illustrated in FIG. 8, the register unit 140a may further include a register to store a count value of the reference clock signal RCLK as will be described with reference to FIGS. 21, 22 and 23, and/or a register to store a count value of a reference pulse signal SRP as will be described with reference to FIGS. 24, 25, 26 and 27.

Figure 9:
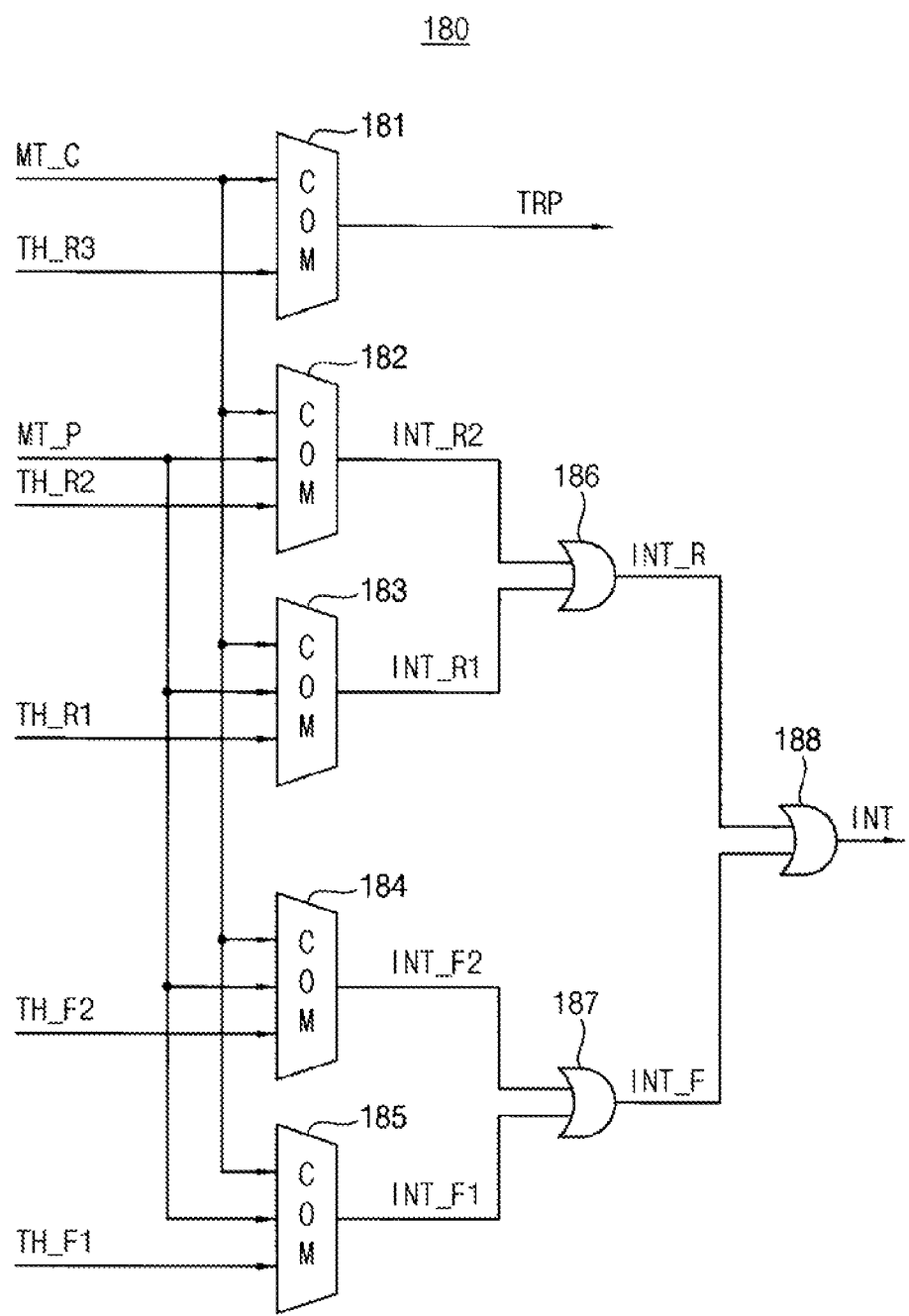
FIG. 9 is a diagram illustrating an exemplary embodiment of an interrupt generator in the temperature management unit of FIG. 5.

FIG. 9 is a diagram illustrating an exemplary embodiment of an interrupt generator in the temperature management unit of FIG. 5.

Referring to FIG. 9, an interrupt generator 180 may receive, from the register unit 140, the current main temperature value MT_C and the previous main temperature value MT_P among the temperature information, and a first temperature rising threshold value TH_R1, a second temperature rising threshold value TH_R2, a third temperature rising threshold value TH_R3, a first temperature falling threshold value TH_F1, and a second temperature falling threshold value TH_F2 among the operational information. The interrupt generator 180 may determine whether the interrupt condition is satisfied to activate the interrupt signal INT. The third temperature rising threshold value TH_R3 may be greater than the second temperature rising threshold value TH_R2 and the second temperature rising threshold value TH_R2 may be greater than the first temperature rising threshold value TH_R1. The second temperature falling threshold value TH_F2 may be greater than the first temperature falling threshold value TH_F1.

The interrupt generator 180 may include first through fifth comparators 181, 182, 183, 184, 185, and first through third OR logic gates 186, 187, 188. The number of the comparators may be changed according to the number of the threshold values.

The first comparator 181 may generate the tripping signal TRP based upon the current main temperature value MT_C and the third temperature rising threshold value TH_R3, that is, a maximum threshold value. For example, the first comparator 181 may activate the tripping signal TRP to the logic high level when the current main temperature value MT_C is greater than the third temperature rising threshold value TH_R3. As described above, the power management unit 500 may block, in response to the tripping signal TRP, the external power supply voltage provided to the SOC 20.

The second comparator 182 may generate a second temperature rising interrupt signal INT_R2 based upon the current main temperature value MT_C, the previous main temperature value MT_P and the second temperature rising threshold value TH_R2. For example, the second comparator 182 may activate the second temperature rising interrupt signal INT_R2 to the logic high level when the previous main temperature value MT_P is smaller than the second temperature rising threshold value TH_R2 and the current main temperature value MT_C is greater than the second temperature rising threshold value TH_R2.

The third comparator 183 may generate a first temperature rising interrupt signal INT_R1 based upon the current main temperature value MT_C, the previous main temperature value MT_P and the first temperature rising threshold value TH_R1. For example, the third comparator 183 may activate the first temperature rising interrupt signal INT_R1 to the logic high level when the previous main temperature value MT_P is smaller than the first temperature rising threshold value TH_R1 and the current main temperature value MT_C is greater than the first temperature rising threshold value TH_R1.

The fourth comparator 184 may generate a second temperature falling interrupt signal INT_F2 based upon the current main temperature value MT_C, the previous main temperature value MT_P and the second temperature falling threshold value TH_F2. For example, the fourth comparator 184 may activate the second temperature falling interrupt signal INT_F2 to the logic high level when the previous main temperature value MT_P is greater than the second temperature falling threshold value TH_F2 and the current main temperature value MT_C is smaller than the second temperature falling threshold value TH_F2. The fifth comparator 185 may generate a first temperature falling interrupt signal INT_F1 based upon the current main temperature value MT_C, the previous main temperature value MT_P and the first temperature falling threshold value TH_F1. For example, the fifth comparator 185 may activate the first temperature falling interrupt signal INT_F1 to the logic high level when the previous main temperature value MT_P is greater than the first temperature falling threshold value TH_F1 and the current main temperature value MT_C is smaller than the first temperature falling threshold value TH_F1.

The first OR logic gate 186 may perform an OR logic operation on the first and second temperature rising interrupt signals INT_R1, INT_R2 to generate a temperature rising interrupt signal INT_R. The second OR logic gate 187 may perform an OR logic operation on the first and second temperature falling interrupt signals INT_F1, INT_F2 to generate a temperature falling interrupt signal INT_F. The third OR logic gate 188 may perform an OR logic operation on the temperature rising interrupt signal INT_R and the temperature falling interrupt signal INT_F to generate the interrupt signal INT.

As a result, the activation of the first temperature rising interrupt signal INT_R1 represents that the main temperature increases across the first temperature rising threshold value TH_R1, and the activation of the second temperature rising interrupt signal INT_R2 represents that the main temperature increases across the second temperature rising threshold value TH_R2. Similarly, the activation of the first temperature falling interrupt signal INT_F1 represents that the main temperature decreases across the first temperature falling threshold value TH_F1, and the activation of the second temperature falling interrupt signal INT_F2 represents that the main temperature decreases across the second temperature falling threshold value TH_F2. The activation of the temperature rising interrupt signal INT_R represents that at least one temperature rising event occurs, and activation of the temperature falling interrupt signal INT_F represents that at least one temperature falling event occurs. The activation of the interrupt signal INT represents that at least one of the temperature rising events and the temperature falling events occurs.

The logic level values of the first and second temperature rising interrupt signals INT_R1, INT_R2 and the first and second temperature falling interrupt signals INT_F1, INT_F2 may be provided to and stored in the register unit 140 as the above-mentioned interrupt status values.

In an exemplary embodiment, only the interrupt signal INT may be provided to the processor 400. When the interrupt signal INT is activated, the processor may determine what kind of event occurs referring to the main temperature values MT_P, MT_C and/or the interrupt status values stored in the register unit 140.

In an exemplary embodiment, the first and second temperature rising interrupt signals INT_R1, INT_R2 and the first and second temperature falling interrupt signals INT_F1, INT_F2 may be provided directly to the processor 400. In this case, the processor may determine what kind of event occurs based upon the received signals without referring to the stored values in the register unit 140.

Figure 10:
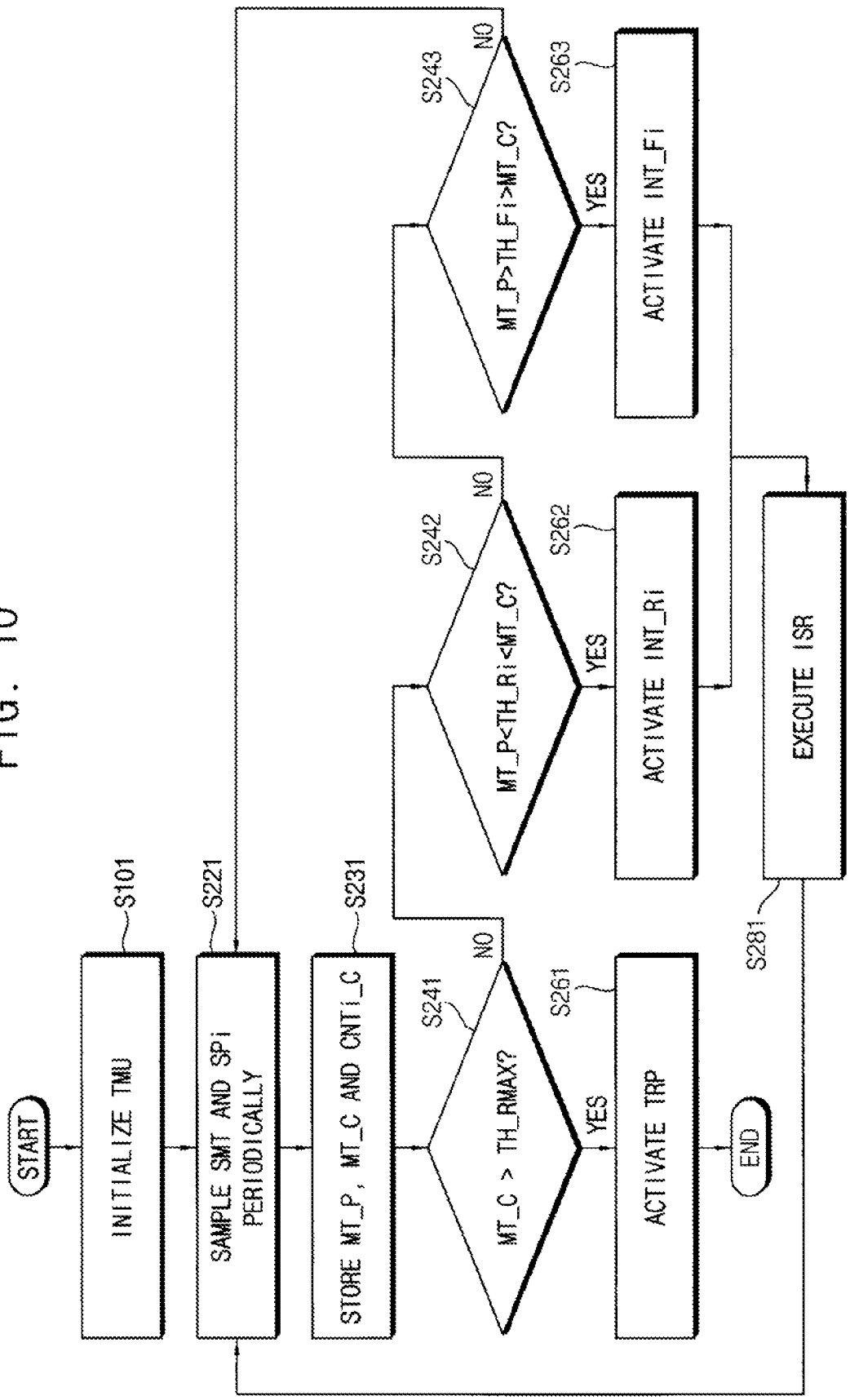
FIG. 10 is a flowchart illustrating a method of managing temperature in an SOC according to an exemplary embodiment.

FIG. 10 is a flowchart illustrating a method of managing temperature in an SOC according to an exemplary embodiment.

Referring to FIGS. 4 through 10, the temperature management unit TMU may be initialized (block S101), for example, by setting the temperature management unit TMU in an enable state in response to the operational control signal DOC from the processor 400 in the SOC 20 and storing operational information in the temperature management unit TMU. When the temperature management unit TMU is initialized, the main sensor MS and the subsidiary sensors SSi are enabled to generate the main temperature signal SMT and the subsidiary temperature signals SPi.

The temperature sampler 160 in the temperature management unit TMU may sample the main temperature signal SMT and subsidiary temperature signals SPi periodically (block S221), and provide the sampled values LAT, CNTi to the register unit 140. The register unit 140 may store the previous main temperature value MT_P, the current main temperature value MT_C and the current subsidiary temperature count values CNTi_C (block S231). The interrupt generator 180 may compare the main temperature values MT_P, MT_C and the threshold values TH_Ri, TH_Fi to determine whether the interrupt condition is satisfied (blocks S241, S242, 243). The interrupt generator 180 may activate the tripping signal TRP (block S261) when the current main temperature value MT_C is greater than the maximum temperature threshold value TH_RMAX (block S241: YES). The interrupt generator 180 may activate the temperature rising interrupt signal INT_Ri (block S262) when the previous main temperature value MT_P is smaller than the temperature rising threshold value TH_Ri and the current main temperature value MT_C is greater than the temperature rising threshold value TH_Ri (block S242: YES). The interrupt generator 180 may activate the temperature falling interrupt signal INT_Fi (block S263) when the previous main temperature value MT_P is greater than the temperature falling threshold value TH_Fi and the current main temperature value MT_C is smaller than the temperature falling threshold value TH_Fi (block S243: YES).

As described above, when the tripping signal TRP is activated, the external power supply voltage may be blocked from being applied to the SOC 20 and thus the temperature management may be completed. When the temperature rising interrupt signal INT_Ri or the temperature falling interrupt signal INT_Fi is activated, the processor 400 may execute the above-mentioned interrupt service routine ISR (block S281). Even though FIG. 10 illustrates that the comparison operations (blocks 241, 242, 243) are performed sequentially, the comparison operations may be performed simultaneously, for example, using the interrupt generator 180 as illustrated in FIG. 9.

Figure 11:
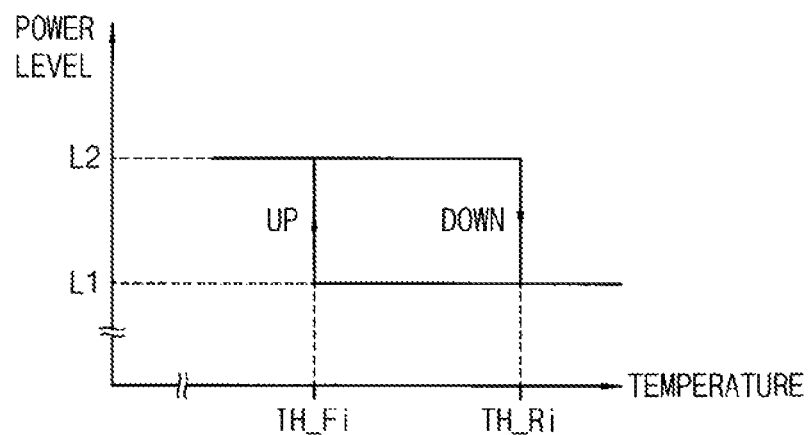
FIGS. 11 and 12 are diagrams for describing temperature management of a hysteresis scheme.
Figure 12:
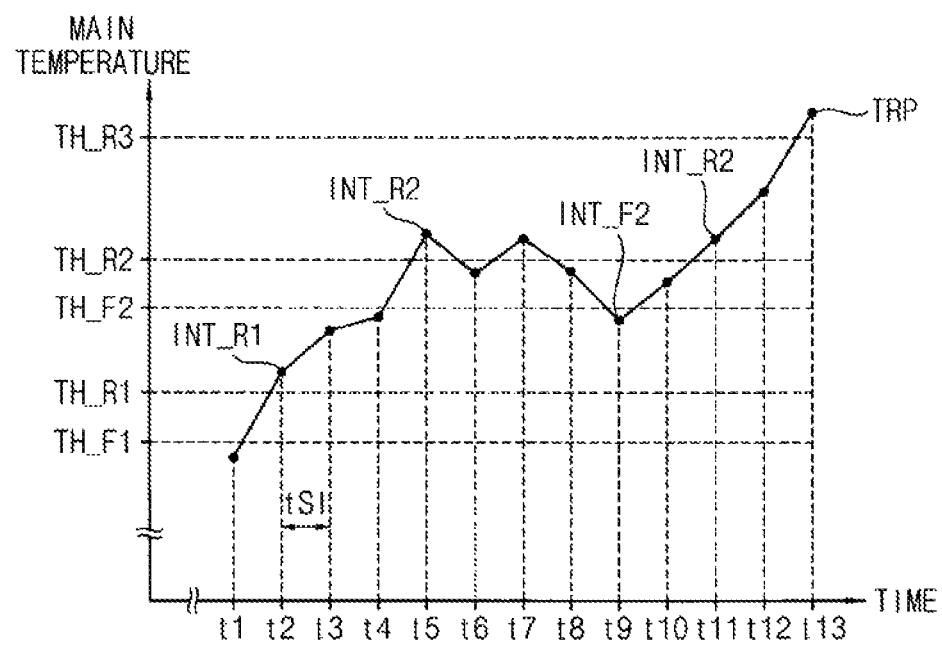

FIGS. 11 and 12 are diagrams for describing temperature management of a hysteresis scheme according to an exemplary embodiment.

The temperature management method according to an exemplary embodiment may be performed using a dynamic voltage & frequency scaling (DVFS) scheme. In the DVFS scheme, a voltage and/or a frequency is dynamically changed according to an operating status of the processor. In the method of managing temperature, at least one of the power supply voltages and the operational frequencies of the SOC and/or the respective subsidiary blocks may be dynamically changed according to the main temperature of the SOC and/or the subsidiary temperatures of the subsidiary blocks. In some embodiments, the operating status of the processor and the temperature may be associated to perform the DVFS scheme.

Referring to FIG. 11, an increase of the power level from a relatively low power level L1 to a relatively high power level L2 may be performed when the temperature becomes smaller than the temperature falling threshold value TH_Fi. When the temperature is changed to the relatively low value, the operational voltages and/or frequencies may be increased to enhance the operational speed or the performance of the SOC and/or the respective subsidiary blocks.

A decrease of the power level from the relatively high power level L2 to a relatively low power level L1 may be performed when the temperature becomes greater than the temperature rising threshold value TH_Ri. When the temperature is changed to the relatively high value, the operational voltages and/or frequencies may be decreased to prevent the incorrect operation and performance degradation of the SOC and/or the respective subsidiary blocks.

As illustrated in FIG. 11, in the hysteresis scheme, the temperature falling threshold value TH_Fi, which is a reference value for increasing the power level, may be smaller than the temperature rising threshold value TH_Ri, which is a reference value for decreasing the power level. As the difference between the temperature falling threshold value TH_Fi and the temperature rising threshold value TH_Ri increases, the power level may be maintained relatively longer without a change. As the difference between the temperature falling threshold value TH_Fi and the temperature rising threshold value TH_Ri decreases, the power level may be changed more frequently. That is, as the difference between the temperature falling threshold value TH_Fi and the temperature rising threshold value TH_Ri increases, the stability of the operation of the SOC may be increased but power consumption may be increased. In contrast, as the difference between the temperature falling threshold value TH_Fi and the temperature rising threshold value TH_Ri decreases, the performance of the SOC may be relatively poor because of a frequent change of the power level. Therefore, the temperature falling threshold value TH_Fi and the temperature rising threshold value TH_Ri may be determined properly based upon a characteristic of the SOC.

An example of the main temperature varying over time is illustrated in FIG. 12. The dots in FIG. 12 represent the main temperature values sampled per sensing period tSI. As described with reference to FIG. 11, the temperature management of the hysteresis scheme may be performed by setting the first temperature falling threshold value TH_F1 smaller than the first temperature rising threshold value TH_R1 and the second temperature falling threshold value TH_F2 smaller than the second temperature rising threshold value TH_R2.

The main temperature is increased across the first temperature rising threshold value TH_R1 between time t1 and time t2 and thus the first temperature rising interrupt signal INT_R1 is activated at time t2. The main temperature is increased across the second temperature rising threshold value TH_R2 between time t4 and time t5 and between time t10 and time t11 and thus the second temperature rising interrupt signal INT_R2 is activated at time t5 and time 11.

Since the temperature falling threshold value is set to be smaller than the temperature rising threshold value according to the hysteresis scheme, the temperature falling interrupt signal is not activated even though the main temperature is decreased back to the value lower than the temperature rising threshold value. For example, the temperature falling interrupt signal is not activated even though the main temperature is decreased across the second temperature rising threshold value TH_R2 between time t5 and time t6. The main temperature is decreased across the second temperature falling threshold value TH_F2 between time t8 and time t9 and thus the second temperature falling interrupt signal INT_F2 is activated at time t9.

The main temperature is increased across the third temperature rising threshold value TH_R3, that is, the maximum temperature threshold value, between time t12 and time t13 and thus the tripping signal TRP is activated to block the external power supply voltage provided to the SOC.

Using such DVFS scheme and the hysteresis scheme, the efficient management of temperature may be performed.

Figure 13:
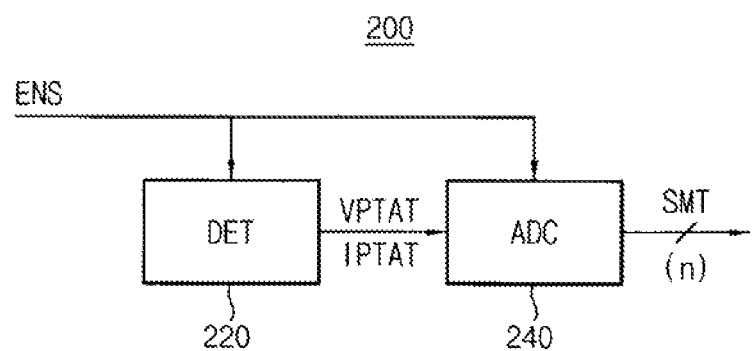
FIG. 13 is a diagram illustrating a main sensor in a temperature management circuit according to an exemplary embodiment.

FIG. 13 is a diagram illustrating a main sensor in a temperature management circuit according to an exemplary embodiment.

Referring to FIG. 13, a main sensor 200 may include a temperature detector (DET) 220 and an analog-to-digital convertor (ADC) 240. The temperature detector 220 may output at least one of a voltage signal VPTAT and a current signal IPTAT proportional to the main temperature. The analog-to-digital converter 240 may convert the output of the temperature detector 220 to a digital signal to generate the main temperature signal SMT of n bits. As described above, the main sensor 200 may be enabled in response to the sensing enable signal ENS from the sensor controller 120.

In general, the analog-to-digital converter 240 may have a relatively complex configuration to perform the analog-to-digital conversion. Thus, the analog-to-digital converter 240 may occupy a relatively large area in the SOC. Since the analog-to-digital converter 240 has to transfer the multi-bits of the main temperature signal SMT, routing of the signal lines may cause a burden to a design of the SOC. According to an exemplary embodiment, the size of the SOC may be reduced and the limitation to routing may be relieved without degrading the performance of temperature management, by implementing the one main sensor 200 with a digital sensor and the other subsidiary sensors with pulse sensors that requires a smaller occupying area and a smaller number of signal lines than the digital sensor.

Figure 14:
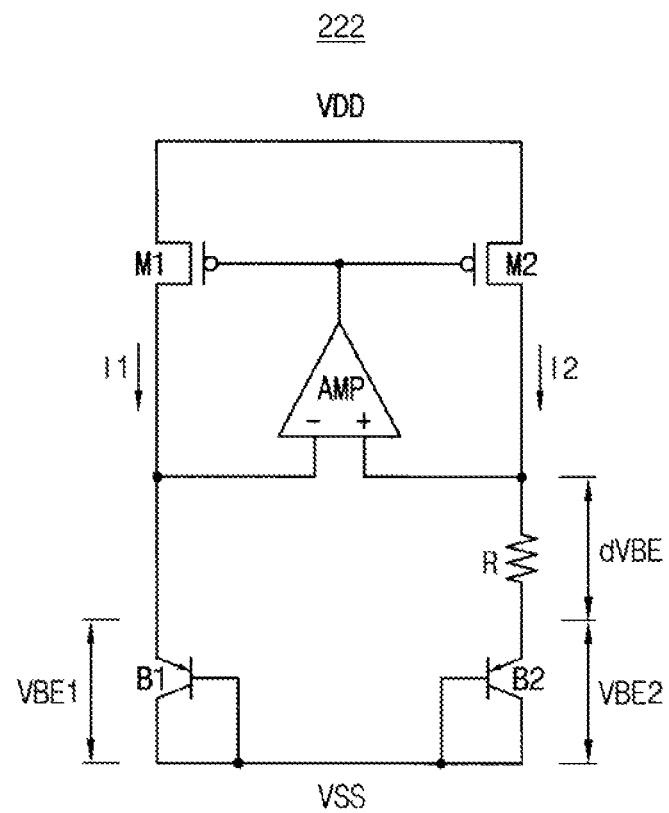
FIG. 14 is a circuit diagram illustrating an exemplary embodiment of a temperature detector in the main sensor of FIG. 13.

FIG. 14 is a circuit diagram illustrating an exemplary embodiment of a temperature detector in the main sensor of FIG. 13.

Referring to FIG. 14, a temperature detector 222 may include first and second PMOS transistors M1, M2, a feedback amplifier AMP, a resistor R and first and second bipolar transistors B1, B2, which are coupled between a power supply voltage VDD and a ground voltage VSS as illustrated in FIG. 14. A voltage dVBE across the resistor R may be obtained as Expression 1

$$dVBE = VBE1 - VBE2 \quad \text{(Expression 1)}$$
$$= VT * \text{Ln}(Ic1/Is1) - VT * \text{Ln}(n * Ic2/Is2)$$
$$= VT * \text{Ln}(n)$$

In Expression 1, Is1 and Is2 indicate reverse saturation currents of the bipolar transistors B1, B2, and Ic1 and Ic2 indicate currents flowing through the bipolar transistors B1, B2, n being a gain ratio of the bipolar transistors B1, B2, and VT indicating a temperature voltage that is proportional to an absolute temperature of the temperature detector 222. Ln(n) is a constant value and thus the voltage dVBE across the resistor R and the current I2 flowing through the resistor R are proportional to the temperature variation. The voltage signal VPTAT and the current signal IPTAT may be output based upon the voltage dVBE and the current I2 proportional to the operational temperature.

Figure 15:
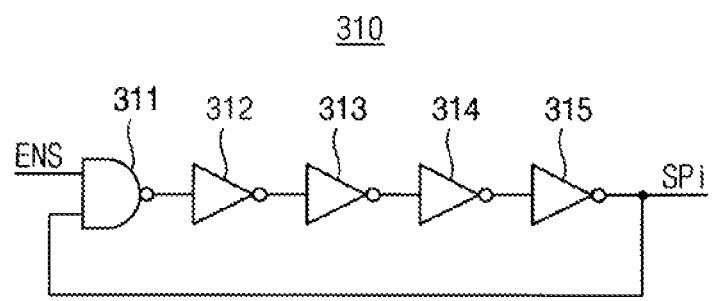
FIG. 15 is a diagram illustrating a subsidiary sensor in a temperature management circuit according to an exemplary embodiment.

FIG. 15 is a diagram illustrating a subsidiary sensor in a temperature management circuit according to an exemplary embodiment.

Each of the subsidiary sensors in the temperature management circuit according to the exemplary embodiment may have the same configuration. In an exemplary embodiment, the subsidiary sensor 310 may include a ring oscillator as illustrated in FIG. 15. The ring oscillator has an operational speed proportional to the subsidiary temperature of a corresponding subsidiary block to output a temperature signal SPi. The ring oscillator may include a NAND logic gate 311 and inverters 312, 313, 314, 315 that are cascade-coupled. The output of the last inverter 315 may be fed-back to the NAND logic gate 311. The ring oscillator may be enabled in response to the sensing enable signal ENS input to the NAND logic gate 311.

The NAND logic gate 311 and the inverters 312, 313, 314, 315 have operational speeds proportional to the temperature and thus the subsidiary temperature signal SPi may have a frequency proportional to the temperature.

Figure 16:
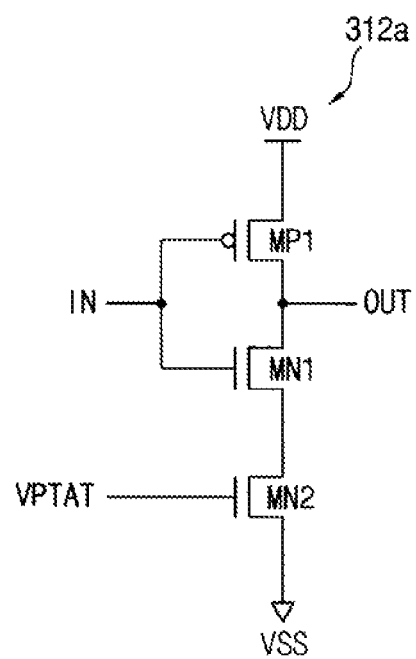
FIGS. 16 and 17 are diagrams illustrating exemplary embodiments of an inverter in the subsidiary sensor of FIG. 15.
Figure 17:
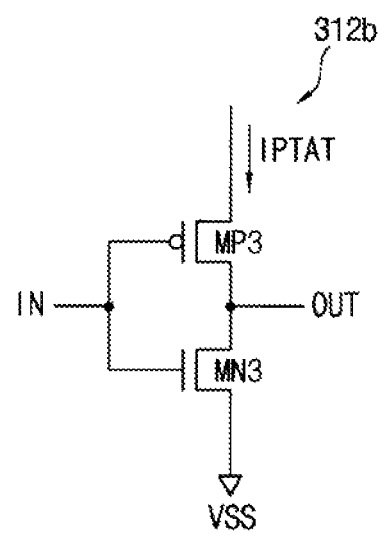

FIGS. 16 and 17 are diagrams illustrating exemplary embodiments of an inverter in the subsidiary sensor of FIG. 15.

Referring to FIG. 16, an inverter 312a may include a first PMOS transistor MP1, a first NMOS transistor MN1 and a second NMOS transistor MN2 that are cascade-coupled between the power supply voltage VDD and the ground voltage VSS. The output signal IN of previous stage (the NAND logic gate or another inverter) is input to gate electrodes of the first PMOS transistor MP1 and the first NMOS transistor. The inverted signal OUT is provided as an input to the next stage. The voltage signal VPTAT, which is proportional to the temperature, is applied to a gate electrode of the second NMOS transistor MN2. As the temperature increases, the sinking current flowing through the second NMOS transistor NM2 increases because the level of the voltage signal VPTAT increases in proportion to the temperature. The operational speed of the inverter 312a may increase depending on the temperature, and thus the subsidiary sensor 310 using the inverters as the inverter 312a of FIG. 16 may output the subsidiary temperature signal SPi having the frequency proportional to the subsidiary temperature.

Referring to FIG. 17, an inverter 312b may include a PMOS transistor MP3 and an NMOS transistor MN3 that receive the output signal IN from the previous stage to output an inverted signal OUT to the next stage. As illustrated in FIG. 17, the inverter 312b may perform the inversion operation by receiving, as a sourcing current, the current signal IPTAT that is proportional to the temperature. As the temperature increases, the sourcing current IPTAT increases and thus the operational speed of the inverter 312b may increase. As a result, the subsidiary sensor 310 using the inverters as the inverter 312b of FIG. 17 may output the subsidiary temperature signal SPi having the frequency proportional to the subsidiary temperature.

Through the above-described configuration, the subsidiary sensors SSi having a relatively small occupying area may be implemented to generate the pulse signals, i.e., the subsidiary temperature signal SPi having the frequencies proportional to the subsidiary temperatures of the respective subsidiary blocks BLKi.

Figure 18:
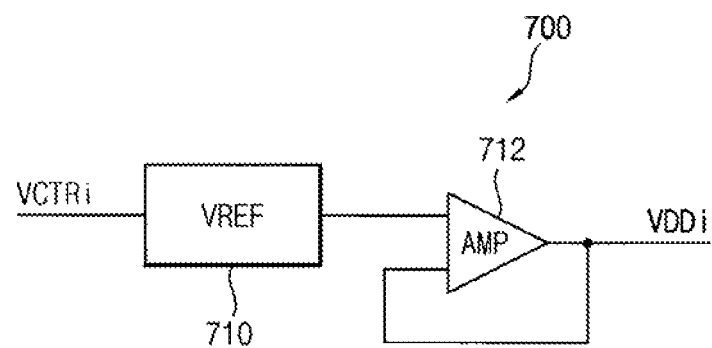
FIGS. 18, 19 and 20 are diagrams illustrating exemplary embodiments for controlling an operation of an SOC.
Figure 19:
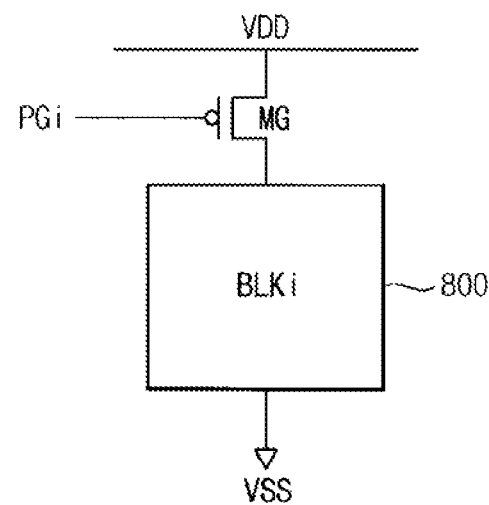
Figure 20:
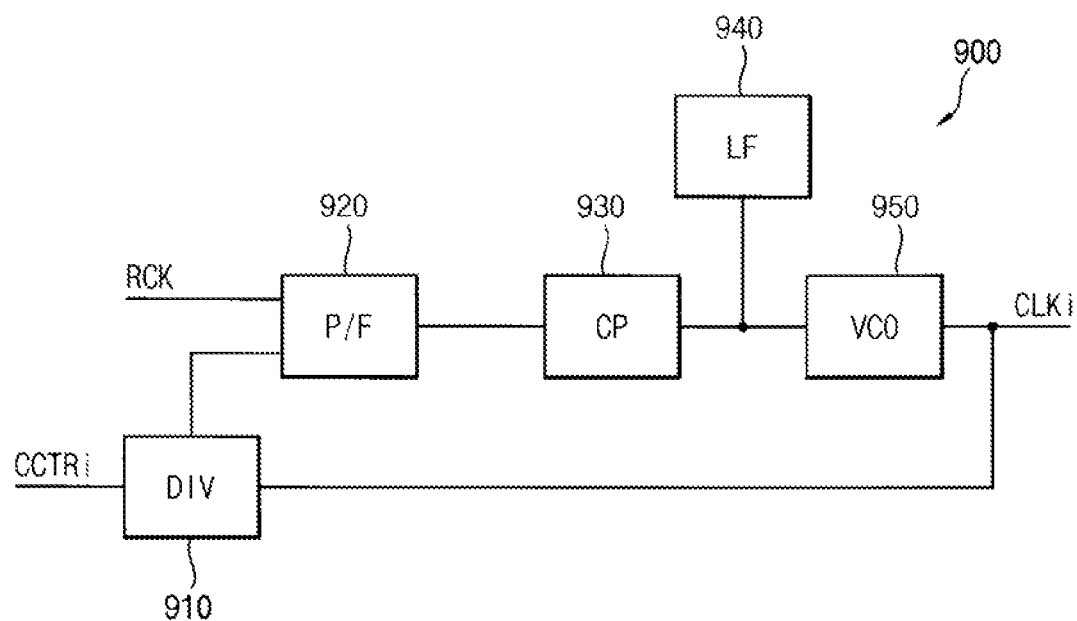

FIGS. 18, 19 and 20 are diagrams illustrating exemplary embodiments for controlling the operation of an SOC.

A voltage regulator 700 of FIG. 18 may include a reference voltage generator VREF 710 configured to generate a reference voltage in response to a voltage control signal VCTRi, and a unity gain amplifier AMP 712 configured to control an output voltage VDDi based upon the reference voltage. The level of the reference voltage may be adjusted by controlling the level of the voltage control signal VCTRi, and thus the level of the output voltage VDDi may be controlled. The output voltage VDDi may be provided as an internal power supply voltage of the SOC and/or a power supply voltage of a corresponding subsidiary block.

Referring to FIG. 19, a subsidiary block BLKi 800 may be coupled to the power supply voltage VDD through a power gating transistor MG. In this case, the voltage provided to the subsidiary block BLKi may be controlled by adjusting a gate voltage signal PGi applied to a gate of the power gating transistor MG.

A phase-locked loop (PLL) 900 of FIG. 20 may control a frequency of an output clock signal CLKi based upon a clock control signal CCTRi. In an exemplary embodiment frequency divider DIV 910 may receive the clock control signal CCTRi and generate a divided clock signal by dividing the fed-back clock signal CLKi in a division ratio corresponding to the clock control signal CCTRi. A phase and frequency detector P/F 920 may generate an up-down signal by comparing the divided clock signal with a reference clock signal RCK. A charge pump CP 930 may generate a control voltage based upon the up-down signal. A loop filter LF 940 may filter the control voltage. A voltage-controlled oscillator VCO 950 may generate the clock signal CLKi in response to the filtered control voltage received from the loop filter LF. As such, the operational frequency, that is, the frequency of the clock signal CLKi of the SOC and/or the respective subsidiary block may be controlled.

The control signal VCTRi, PGi and CCTRi of FIGS. 18, 19 and 20 may be the temperature management signal TM that is generated as the result of executing the interrupt service routine ISR by the processor 400 of FIG. 4. FIGS. 18, 19 and 20 illustrate non-limiting examples of controlling the operational speeds of the SOC and the subsidiary blocks, and the operation speeds may be controlled using various voltage regulators and/or clock regulators.

Figure 21:
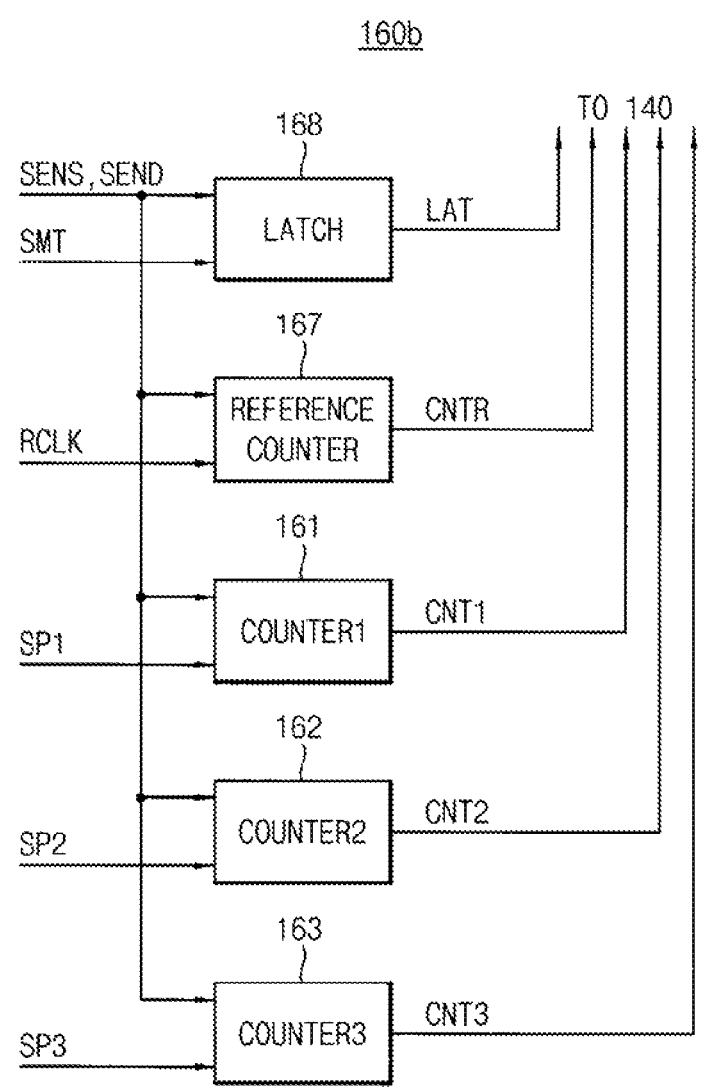
FIG. 21 is a block diagram illustrating an exemplary embodiment of a temperature sampler in the temperature management unit of FIG. 5.

FIG. 21 is a block diagram illustrating an exemplary embodiment of a temperature sampler in the temperature management unit of FIG. 5.

Referring to FIG. 21, a temperature sampler 160b may include a latch unit 168, a plurality of subsidiary temperature counters 161, 162, 163, and a reference counter 167. Compared with the temperature sampler 160a of FIG. 6, the temperature sampler 160 may further include the reference counter 167.

The latch unit 168 may latch the main temperature signal SMT periodically to provide a main temperature value LAT per sensing period. As described above, the sensing period may be determined based upon the activation timings of the sensing-start signal SENS and the sensing-done signal SEND. The subsidiary temperature counters 161, 162, 163 may count pulses of the subsidiary temperature signals SP1, SP2, SP3 periodically to provide subsidiary temperature count values CNT1, CNT2, CNT3 per sensing period.

The reference counter 167 may count cycles of a reference clock signal RCLK periodically to provide a reference count value CNTR, where the reference clock signal RCLK has a reference frequency independent of temperature. The reference clock signal RCLK may be generated using a crystal oscillator that may be disposed externally out of the SOC.

The main temperature value LAT, the reference count value CNTR and the subsidiary temperature count values CNT1, CNT2, CNT3 may be provided to the register unit 140. The main temperature value LAT, the reference count value CNTR and the subsidiary temperature count values CNT1, CNT2, CNT3 may be stored in the register unit 140a as described with reference to FIG. 8. In this case, the register unit 140a may further include a register to store a current reference count value based upon the reference count value CNTR that is provided periodically.

Figure 22:
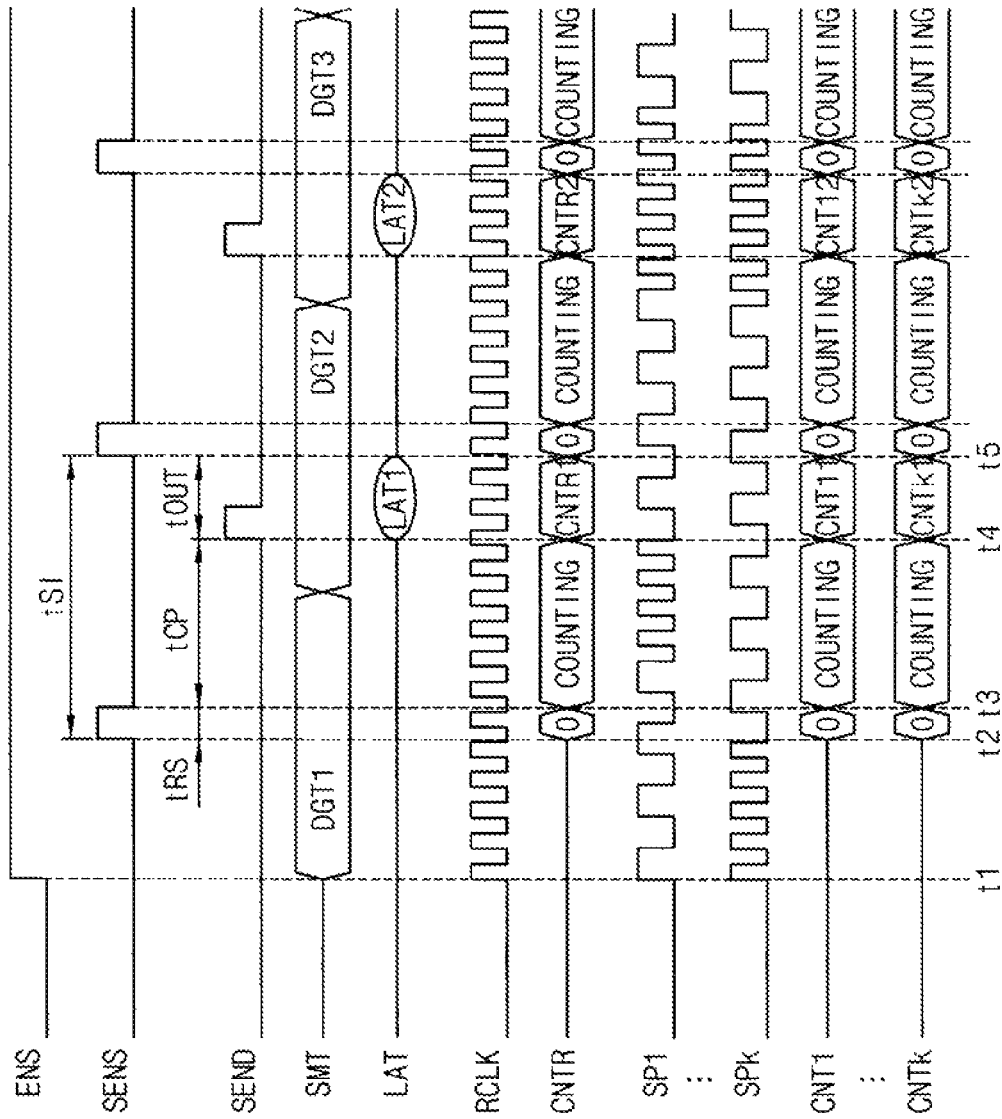
FIG. 22 is a timing diagram illustrating the operation of a temperature management unit according to an exemplary embodiment.

FIG. 22 is a timing diagram illustrating the operation of a temperature management unit according to an exemplary embodiment. FIG. 22 illustrates the operation corresponding to the embodiment of FIG. 21 where the temperature sampler 160b further includes the reference counter 167.

Referring to FIG. 22, the sensing enable signal ENS is activated at time t1 when the temperature management unit TMU is initialized. The main sensor MS and the subsidiary sensors SPi (i=1, 2, . . . , k) begin generating the main temperature signal SMT and the subsidiary temperature signals SPi in response to the sensing enable signal ENS. The main temperature signal SMT represents digital values DGT1, DGT2, DGT3 of the main temperature that are measured periodically. The measurement period of the digital values DGT1, DGT2, DGT3 may be determined according to a configuration of the main sensor MS and/or a control of the sensor controller 120. The subsidiary temperature signals SPi are provided as the pulse signals having the respective frequencies corresponding to the subsidiary temperatures of the subsidiary blocks BLKi. The reference clock signal RCLK may be generated using a crystal oscillator as described above to have the substantially constant frequency independent of the temperature.

When the sensing-start signal SENS is activated at time t2, the latch circuit 168, the reference counter 167 and the subsidiary temperature counters 161, 162, 163 in the temperature sampler 160b may be reset. The reference counter 167 and the subsidiary temperature counters 161, 162, 163 may start the counting operation at time t3 after the reset time interval tRS. When the sensing-done signal SEND is activated at time t4 after the counting period tCP, the latch unit 168 may latch the digital value DGT1 of the main temperature signal SMT and the sampled main temperature value LAT1 is provided to the register unit 140. At time t4, the counting operation of the reference counter 167 and the subsidiary temperature counters 161, 162, 163 may be completed and the sampled reference count value CNTR1 and the sampled subsidiary temperature count values CNTi1 are provided to the register unit 140.

After the output time interval tOUT, the sensing-start signal SENS is activated again at time t5. The above-mentioned resetting, counting, sampling and outputting operations are repeated and the next main temperature value LAT2, the next reference count value CNTR2 and the next subsidiary temperature count values CNTi2 may be provided to the register unit 140.

As such, the main temperature signal SMT, the reference clock signal RCLK and the subsidiary temperature signals SPi may be sampled per sensing period tSI and the sampled values LAT, CNTR, CNTi may be provided periodically to the register unit 140.

Figure 23:
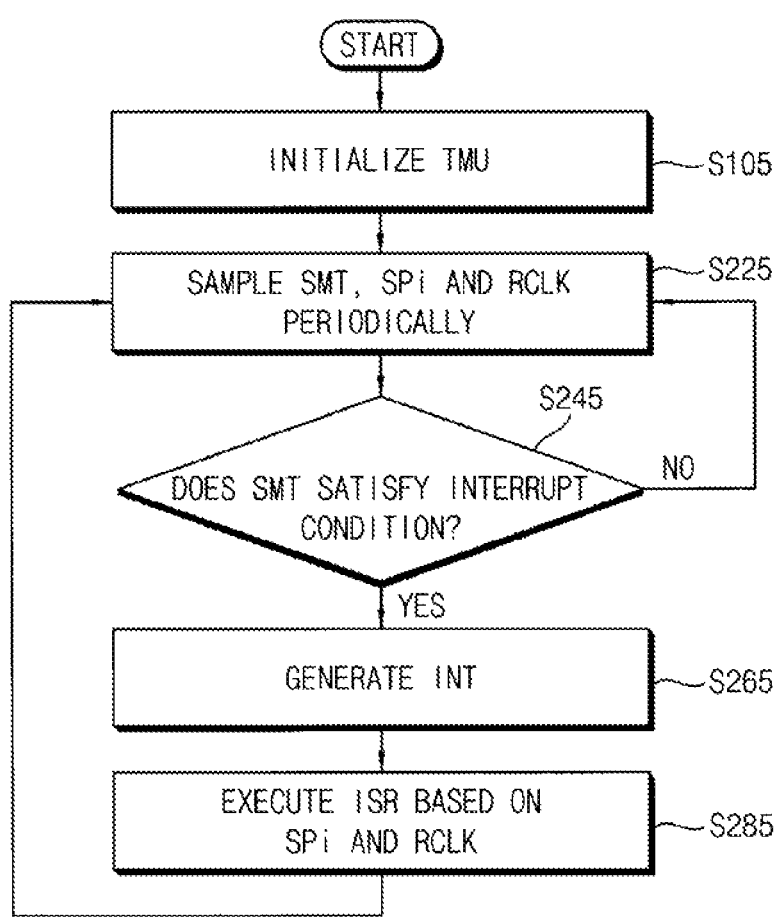
FIG. 23 is a flowchart illustrating a method of managing temperature in an SOC according to an exemplary embodiment.

FIG. 23 is a flowchart illustrating a method of managing temperature in an SOC according to an exemplary embodiment.

Referring to FIGS. 2, 4, 22 and 23, the temperature management unit TMU may be initialized (block S105), for example, by setting the temperature management unit TMU in an enable state in response to a control signal from a processor in the SOC and storing operational information in the temperature management unit TMU. When the temperature management unit TMU is initialized, the main sensor MS and the subsidiary sensors SSi are enabled to generate the main temperature signal SMT and the subsidiary temperature signals SPi, and the reference clock signal RCLK may be provided.

The temperature management unit TMU may sample the main temperature signal SMT, the reference clock signal RCLK and subsidiary temperature signals SPi periodically (block S225). The temperature management unit TMU may determine whether the sampled value of the main temperature signal SMT satisfies interrupt condition (block S245) regardless of the sampled values of the subsidiary temperature signals SSi. The interrupt condition may be set to determine whether noticeable variation of the main temperature occurs in the SOC.

When the main temperature signal SMT does not satisfy the interrupt condition (block S245: NO), the temperature management unit TMU may sample the main temperature signal SMT, the reference clock signal RCLK and the subsidiary temperature signals (block S225) of the next sampling period to determine whether the next sampled value of the main temperature signal SMT satisfies the interrupt condition (block S245).

When the main temperature signal SMT satisfies the interrupt condition (block S245: YES), the temperature management unit TMU may generate the interrupt signal INT (block S265). When the interrupt signal INT is generated, the interrupt service routine ISR may be executed based upon the sampled values of the reference clock signal RCLK and the subsidiary temperature signals SPi (block S285). The interrupt service routine ISR may be implemented as software, hardware or combination thereof for analyzing the temperature distribution of the subsidiary blocks BLKi to take proper steps. For example, the interrupt service routine ISR may be a program executed by the processor in the SOC.

As such, the main temperature of the SOC may be monitored to generate the interrupt signal INT based upon the main temperature signal SMT regardless of the subsidiary temperature signals SPi, the subsidiary temperature signals SPi may be considered only when the interrupt signal INT is generated, and thus efficient and prompt temperature management may be performed.

The interrupt service routine ISR may be executed based upon the sampled values of the reference clock signal RCLK and the subsidiary temperature signals SPi as follows.

Current subsidiary temperature frequencies may be calculated based upon the current subsidiary temperature count values CNTi_C, the current reference count value CNTR_C and the reference frequency, where each of the current subsidiary temperature frequencies is proportional to each of the subsidiary temperatures. For example, the current subsidiary temperature frequencies may be calculated using Expression 2.

$$Fj=(CNTj\_C/CNTR\_C)*Fr \quad \text{(Expression 2)}$$

In Expression 2, Fj and CNTj_C indicate the frequency and the subsidiary temperature count value of the j-th subsidiary temperature signal SPj, and Fr and CNTR_C indicate the reference frequency and the current reference count value of the reference clock signal RCLK. The calculation of Expression 2 is based upon the assumption that the sensing period, i.e. the sampling period is identical with respect to the reference clock signal RCLK and the subsidiary temperature signals SPi. After the subsidiary temperature frequencies Fi are calculated, the difference Tj−Tk between the two current subsidiary temperature values may be calculated using Expression 3.

$$Tj-Tk=b1*(Fj-Fk) \quad \text{(Expression 3)}$$

In Expression 3, Tj and Tk indicate the current subsidiary temperature values of the j-th and k-th subsidiary blocks BLKj, BLKk, Fj and Fk indicate the frequencies of the j-th and k-th subsidiary blocks BLKj, BLKk, which may be obtained using Expression 2, and b1 indicates a constant value. The constant b1 may be determined through experiments under real operational conditions after the SOC including the temperature management circuit is integrated.

The respective current subsidiary temperature values may be calculated using Expression 4.

$$Tj=c1*Fj+c2 \quad \text{(Expression 4)}$$

In Expression 4, Tj indicates the current subsidiary temperature value of the j-th subsidiary block BLKj, Fj indicates the frequency of the j-th subsidiary temperature signal SPj, which may be calculated using Expression 2, and c1 and c2 indicate constant values. Also the constants c1 and c2 may be determined through experiments under real operational conditions after the SOC including the temperature management circuit is integrated.

The calculations of Expressions 3 and 4 are based upon the assumption that the frequencies of the subsidiary temperature signals SPi are proportional to the subsidiary temperature. The respective operational speeds of the subsidiary blocks may be controlled based upon the differences Tj−Tk between the current subsidiary temperature values and/or the current subsidiary temperature value Tj.

Figure 24:
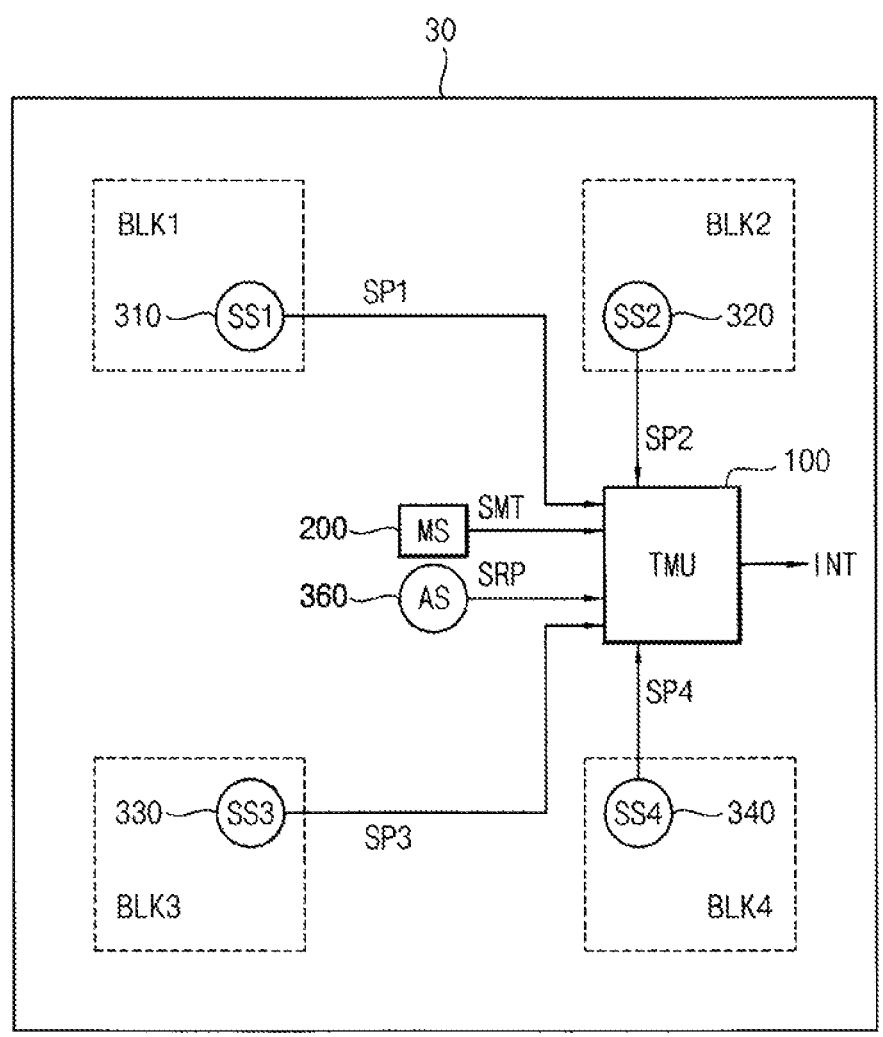
FIG. 24 is a diagram illustrating a layout of a temperature management circuit in an SOC according to an exemplary embodiment.

FIG. 24 is a diagram illustrating a layout of a temperature management circuit in an SOC according to an exemplary embodiment.

Referring to FIG. 24, a temperature management circuit in an SOC 30 includes a temperature management unit (TMU) 100, a main sensor (MS) 200, a plurality of subsidiary sensors SS1 310, SS2 320, SS3 330, SS4 340, and an additional subsidiary sensor (AS) 360. FIG. 24 illustrates four subsidiary sensors for convenience of description, but the number of the subsidiary sensors may vary according to the configuration of the SOC 30. Other elements in the SOC 30 are omitted except for the temperature management circuit.

Compared with the temperature management circuit of FIG. 2, the temperature management circuit of FIG. 24 may further include the additional subsidiary sensor 360, and the repeated descriptions are omitted.

The additional subsidiary sensor 360 may be disposed near the main sensor 200, to generate a reference pulse signal SRP having a frequency corresponding to the main temperature. The additional subsidiary sensor 360 may have the same configuration as the other subsidiary sensors 310, 320, 330, 340.

The temperature management unit 100 may generate temperature information of the SOC 30 based upon the main temperature signal SMT, the reference pulse signal SRP and the subsidiary temperature signals SPi. As will be described with reference to FIGS. 25 and 26, the temperature information may include the current main temperature value MT_C, the previous main temperature value MT_P, the current subsidiary temperature count values CNTi_C and the current reference count value CNTR_C. The temperature information may be stored in the temperature management unit 100 and may be provided to a processor in the SOC 30. The temperature management unit 100 may generate an interrupt signal INT based upon the stored temperature information, and the processor may perform an interrupt service routine ISR in response to the interrupt signal INT to analyze the temperature information and control the operation of the SOC.

The main sensor 200, the subsidiary sensors 310, 320, 330, 340, and the additional subsidiary sensor 360 may be on-chip sensors that are integrated at a same semiconductor substrate at which the SOC 30 is integrated. The on-chip sensors may generate output signals that reflect the temperatures to be measured and may reduce the size of the SOC 30.

Figure 25:
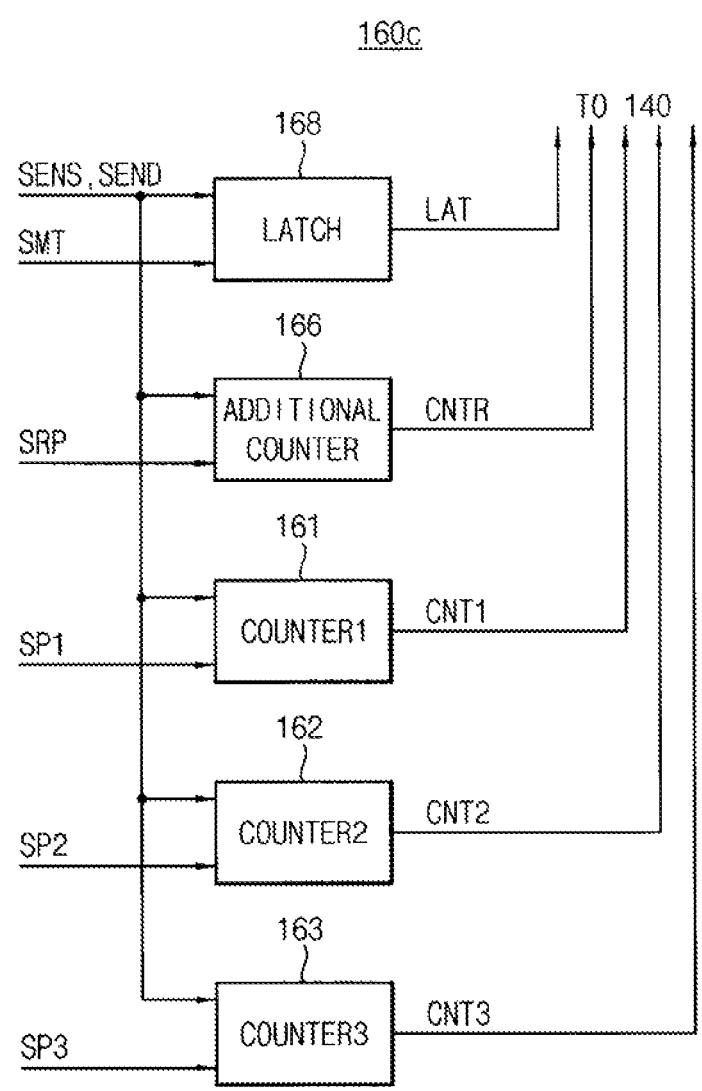
FIG. 25 is a block diagram illustrating an exemplary embodiment of a temperature sampler in the temperature management unit of FIG. 24.

FIG. 25 is a block diagram illustrating an exemplary embodiment of a temperature sampler in the temperature management unit of FIG. 24.

Referring to FIG. 25, a temperature sampler 160c may include a latch unit 168, a plurality of subsidiary temperature counters 161, 162, 163, and an additional counter 166. Compared with the temperature sampler 160a of FIG. 6, the temperature sampler 160 may further include the additional counter 166.

The latch unit 168 may latch the main temperature signal SMT periodically to provide a main temperature value LAT per sensing period. As described above, the sensing period may be determined based upon the activation timings of the sensing-start signal SENS and the sensing-done signal SEND. The subsidiary temperature counters 161, 162, 163 may count pulses of the subsidiary temperature signals SP1, SP2, SP3 periodically to provide subsidiary temperature count values CNT1, CNT2, CNT3 per sensing period.

The additional counter 167 may count pulses of the reference pulse signal SRP periodically to provide a reference count value CNTR.

The main temperature value LAT, the reference count value CNTR and the subsidiary temperature count values CNT1, CNT2, CNT3 may be provided to the register unit 140. The main temperature value LAT, the reference count value CNTR and the subsidiary temperature count values CNT1, CNT2, CNT3 may be stored in the register unit 140a as described with reference to FIG. 8. In this case, the register unit 140a may further include a register to store a current reference count value based upon the reference count value CNTR that is provided periodically.

Figure 26:
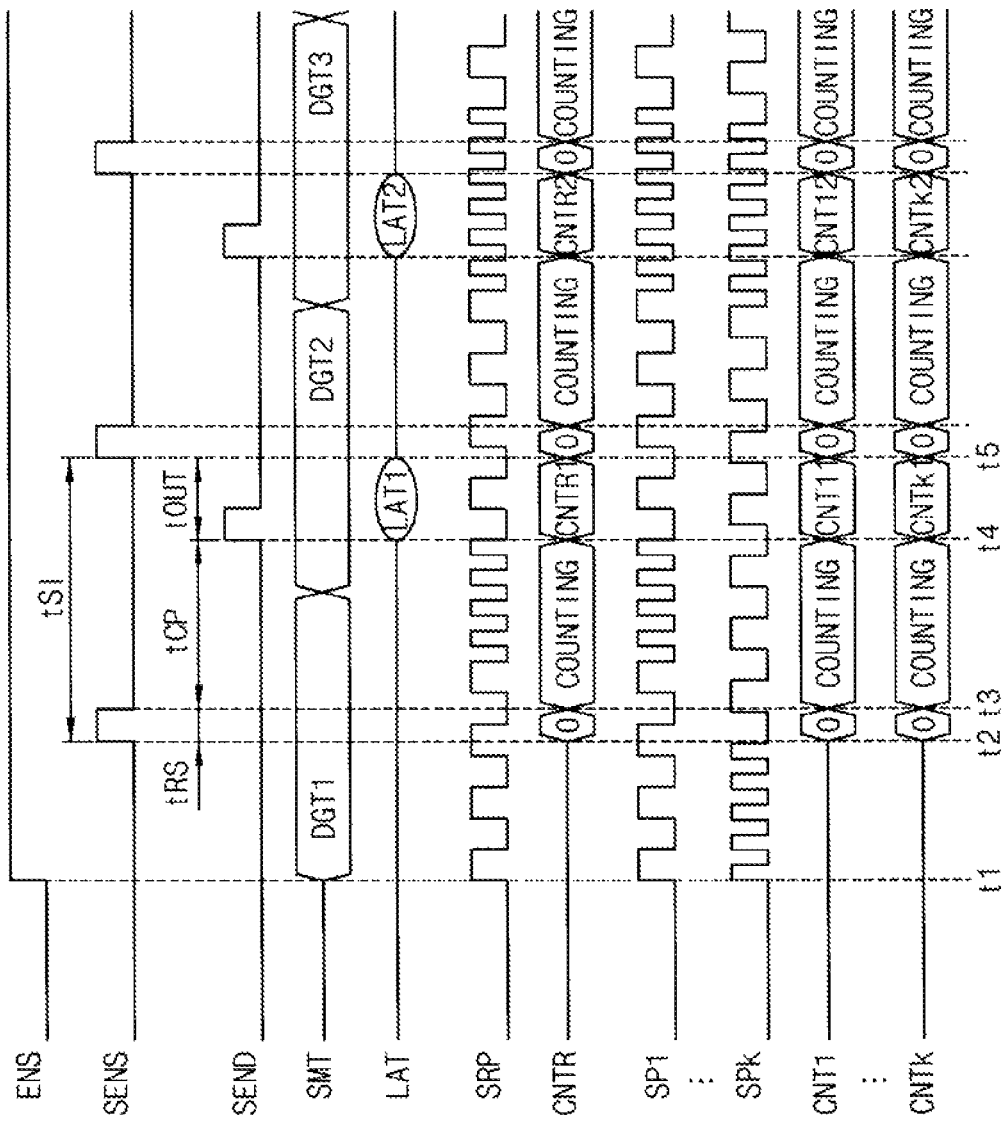
FIG. 26 is a timing diagram illustrating the operation of a temperature management unit according to an exemplary embodiment.

FIG. 26 is a timing diagram illustrating the operation of a temperature management unit according to an exemplary embodiment.

Referring to FIG. 26, the sensing enable signal ENS is activated at time t1 when the temperature management unit TMU is initialized. The main sensor MS and the subsidiary sensors SPi (i=1, 2, . . . , k) begin generating the main temperature signal SMT and the subsidiary temperature signals SPi in response to the sensing enable signal ENS. The main temperature signal SMT represents digital values DGT1, DGT2, DGT3 of the main temperature that are measured periodically. The measurement period of the digital values DGT1, DGT2, DGT3 may be determined according to a configuration of the main sensor MS and/or a control of the sensor controller 120. The subsidiary temperature signals SPi are provided as the pulse signals having the respective frequencies corresponding to the subsidiary temperatures of the subsidiary blocks BLKi. The reference pulse signal SRP may be a pulse signal having a frequency corresponding to the main temperature.

When the sensing-start signal SENS is activated at time t2, the latch circuit 168, the additional counter 166 and the subsidiary temperature counters 161, 162, 163 in the temperature sampler 160c may be reset. The additional counter 166 and the subsidiary temperature counters 161, 162, 163 may start the counting operation at time t3 after the reset time interval tRS. When the sensing-done signal SEND is activated at time t4 after the counting period tCP, the latch unit 168 may latch the digital value DGT1 of the main temperature signal SMT and the sampled main temperature value LAT1 is provided to the register unit 140. At time t4, the counting operation of the additional counter 166 and the subsidiary temperature counters 161, 162, 163 may be completed and the sampled reference count value CNTR1 and the sampled subsidiary temperature count values CNTi1 are provided to the register unit 140.

After the output time interval tOUT, the sensing-start signal SENS is activated again at time t5. Above-mentioned resetting, counting, sampling and outputting operations are repeated and the next main temperature value LAT2, the next reference count value CNTR2 and the next subsidiary temperature count values CNTi2 may be provided to the register unit 140.

As such, the main temperature signal SMT, the reference pulse signal SRP and the subsidiary temperature signals SPi may be sampled per sensing period tSI and the sampled values LAT, CNTR, CNTi may be provided periodically to the register unit 140.

Figure 27:
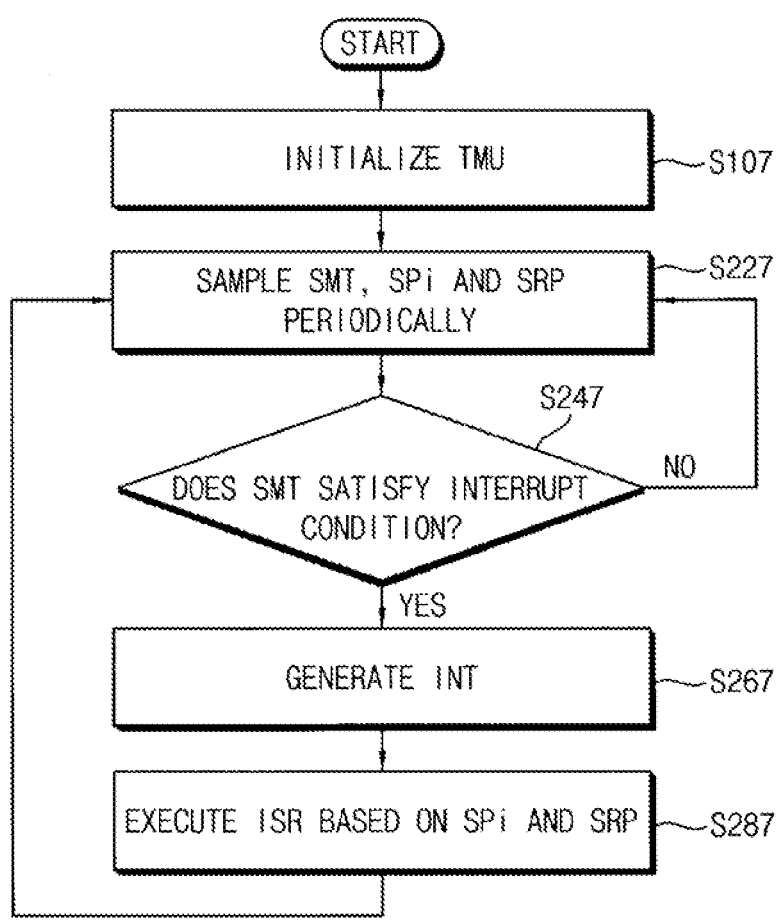
FIG. 27 is a flowchart illustrating a method of managing temperature in an SOC according to an exemplary embodiment.

FIG. 27 is a flowchart illustrating a method of managing temperature in an SOC according to an exemplary embodiment.

Referring to FIGS. 4, 24, 25 and 26, the temperature management unit TMU may be initialized (block S107), for example, by setting the temperature management unit TMU in an enable state in response to a control signal from a processor in the SOC and storing operational information in the temperature management unit TMU. When the temperature management unit TMU is initialized, the main sensor MS, the subsidiary sensors SSi and the additional sensor AS are enabled to generate the main temperature signal SMT, the subsidiary temperature signals SPi and the reference pulse signal SRP.

The temperature management unit TMU may sample the main temperature signal SMT, subsidiary temperature signals SPi and the reference pulse signal SRP periodically (block S227). The temperature management unit TMU may determine whether the sampled value of the main temperature signal SMT satisfies interrupt condition (block S247) regardless of the sampled values of the subsidiary temperature signals SSi. The interrupt condition may be set to determine whether noticeable variation of the main temperature occurs in the SOC.

When the main temperature signal SMT does not satisfy the interrupt condition (block S247: NO), the temperature management unit TMU may sample the main temperature signal SMT, the reference clock signal RCLK and the subsidiary temperature signals (block S227) of the next sampling period to determine whether the next sampled value of the main temperature signal SMT satisfies the interrupt condition (block S247).

When the main temperature signal SMT satisfies the interrupt condition (block S247: YES), the temperature management unit TMU may generate the interrupt signal INT (block S267). When the interrupt signal INT is generated, the interrupt service routine ISR may be executed based upon the sampled values of the subsidiary temperature signals SPi and the reference pulse signal SRP and (block S287). The interrupt service routine ISR may be implemented as software, hardware or combination thereof for analyzing the temperature distribution of the subsidiary blocks BLKi to take proper steps. For example, the interrupt service routine ISR may be a program executed by the processor in the SOC.

As such, the main temperature of the SOC may be monitored to generate the interrupt signal INT based upon the main temperature signal SMT regardless of the subsidiary temperature signals SPi, the subsidiary temperature signals SPi may be considered only when the interrupt signal INT is generated, and thus efficient and prompt temperature management may be performed.

The interrupt service routine ISR may be executed based upon the sampled values of the subsidiary temperature signals SPi and the reference pulse signal SRP as follows.

Current subsidiary temperature values of the subsidiary blocks may be calculated based upon the current subsidiary temperature count values CNTi_C and the current reference count value CNTR_C. For example, the current subsidiary temperature values may be calculated using Expression 5.

$$Tj=(CNTj\_C/CNTR\_C)*MT\_C \qquad \text{(Expression 5)}$$

In Expression 5, Tj indicates the current subsidiary temperature value of the j-th subsidiary block BLKj, MT_C indicates the current main temperature value, CNTj_C indicates the current subsidiary temperature count value of the j-th subsidiary temperature signal SPj, and CNTR_C indicates the current reference count value. The calculation of Expression 5 is based upon the assumption that the sensing period, i.e. the sampling period is identical with respect to the reference pulse signal SRP and the subsidiary temperature signals SPi, and the assumption that the frequencies of the subsidiary temperature signals SPi and the reference pulse signal SRP are proportional to the respective temperature. The respective operational speeds of the subsidiary blocks may be controlled based upon the obtained current subsidiary temperature values Ti.

In an exemplary embodiment, the processor 400 of FIG. 4 may receive the temperature information DTI from the temperature management unit 100 regardless of the interrupt signal INT. The temperature information DTI may include sampled values of the subsidiary temperature signals SPi and the reference pulse signal SRP. The processor 400 may calculate the current subsidiary temperature values of the subsidiary blocks BLKi, for example, using Expression 5. As a result, in case of the embodiments described with reference to FIGS. 24 through 27, the processor 400 may control the operational speeds of the respective subsidiary blocks BLKi based upon the current subsidiary temperature values Ti that may be obtained periodically, regardless of the variation of the main temperature signal SMT.

Figure 28:
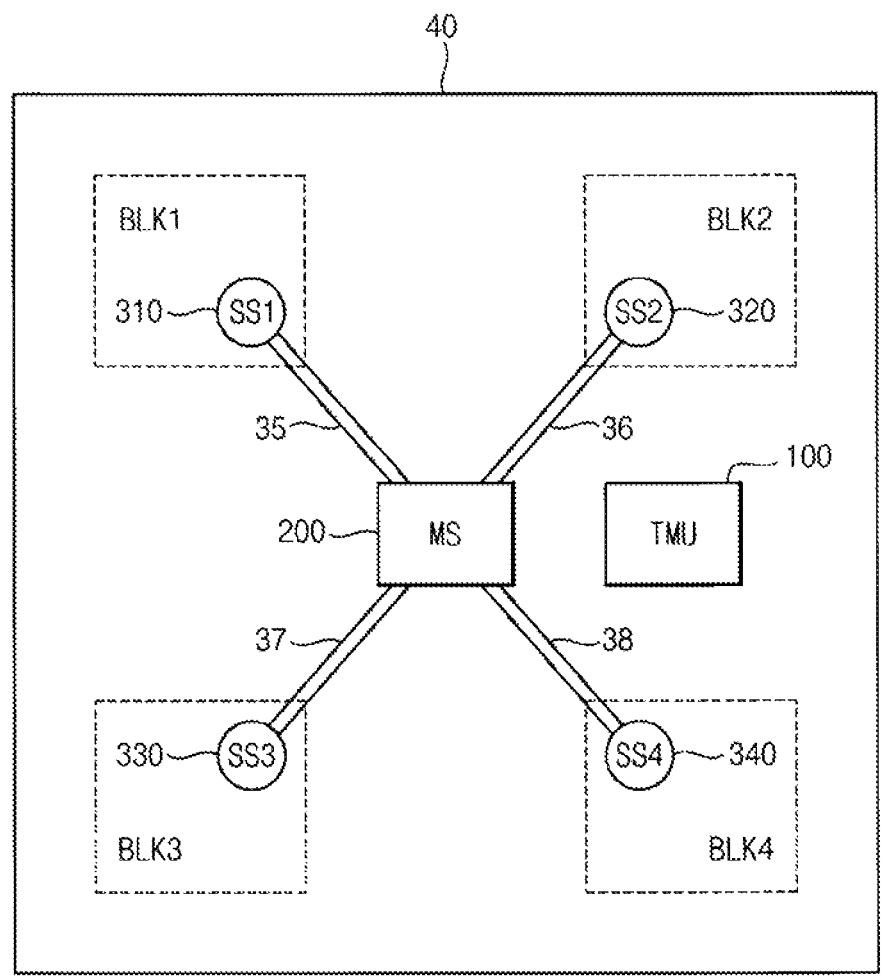
FIG. 28 is a diagram illustrating a layout of a temperature management circuit in an SOC according to an exemplary embodiment.

FIG. 28 is a diagram illustrating a layout of a temperature management circuit in an SOC according to an exemplary embodiment.

Referring to FIG. 28, a temperature management circuit in an SOC 40 includes a temperature management unit (TMU) 100, a main sensor (MS) 200, a plurality of subsidiary sensors SS1 310, SS2 320, SS3 330, SS4 340, and a plurality of heat bridges 35, 36, 37, 38. FIG. 28 illustrates four subsidiary sensors for convenience of description, but the number of the subsidiary sensors may vary according to the configuration of the SOC 40. Other elements in the SOC 40 are omitted except for the temperature management circuit.

Compared with the temperature management circuit of FIG. 2, the temperature management circuit of FIG. 28 may further include the heat bridges 35, 36, 37, 38, and the repeated descriptions are omitted.

The heat bridges 35, 36, 37, 38 may have a heat conductivity higher than a heat conductivity of a semiconductor substrate at which the SOC 40 is integrated, and the heat bridges 35, 36, 37, 38 may thermally couple the subsidiary sensors 310, 320, 330, 340 to the main sensor 200, respectively. The performance of the temperature management circuit may depend on how exactly the main temperature measured by the main sensor 200 reflects the overall temperature of the SOC 40.

As descried with reference to FIG. 2, the main sensor 200 may be integrated at a proper position for exactly reflecting the overall temperature of the SOC 40. For example, the main sensor 200 may be disposed at the position so that deviation of the distances from the main sensor 200 to the subsidiary sensors 310, 320, 330, 340 may be minimized. When heat conductivity of intervening materials between the main sensor 200 and the subsidiary sensors 310, 320, 330, 340 are different, the position of the main sensor 200 may be determined considering the heat conductivity. The heat bridges 35, 36, 37, 38 may have relatively high heat conductivity, and thus contribute to reducing the deviation of the heat conductivities between the main sensor 200 and the respective subsidiary sensors 310, 320, 330, 340. Accordingly the heat bridges 35, 36, 37, 38 may reduce the difference between the measured main temperature and the overall temperature of the SOC 40.

As described above, the main sensor 200 and the subsidiary sensors 310, 320, 330, 340 may be on-chip sensors that are integrated at a same semiconductor substrate at which the SOC 40 is integrated. The on-chip sensors may generate output signals exactly reflecting the temperatures to be measured and may reduce the size of the SOC 40.

Figure 29:
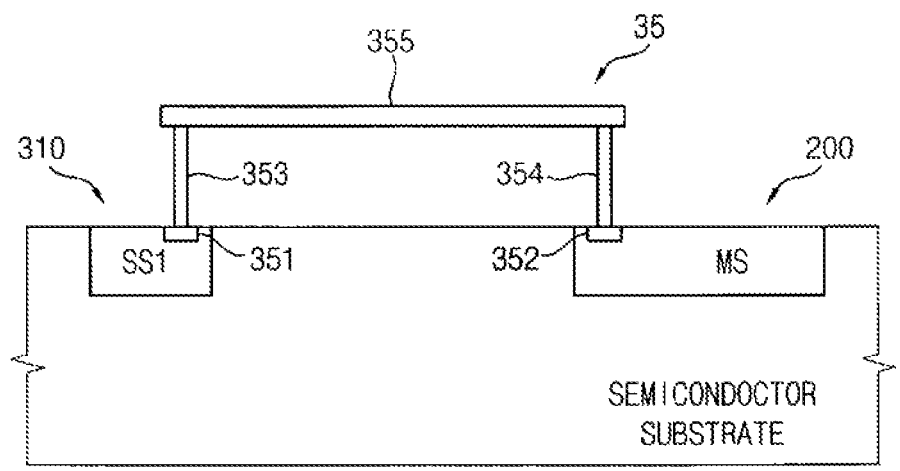
FIG. 29 is a diagram illustrating a heat bridge in the temperature management circuit of FIG. 28.

FIG. 29 is a diagram illustrating a heat bridge in the temperature management circuit of FIG. 28.

Referring to FIG. 29, the first subsidiary sensor 310, the main sensor 200 and the heat bridge 35 for thermally coupling the first subsidiary sensor 310 and the main sensor 200 may be integrated using a semiconductor substrate. The other heat bridges 36, 37, 38 in FIG. 28 may be formed in a similar fashion as the heat bridge 35 in FIG. 29. As illustrated in FIG. 29, the heat bridge 35 may include electrodes 351, 352 formed on the surface portion of the semiconductor substrate, vertical contacts 353, 354 such as vias, and a metal line 355. The electrodes may be formed to have a large occupying area as possible as the design margin allows. The metal line 355 may be patterned in a metal layer in which signal lines and voltage lines are patterned.

As such, using the heat bridges 35, 36, 37, 38 between the main sensor 200 and the respective subsidiary sensors 310, 320, 330, 340, which have relatively high heat conductivity compared with the semiconductor substrate, the performance of the temperature management circuit and the SOC 40 including the temperature management circuit may be enhanced.

Figure 30:
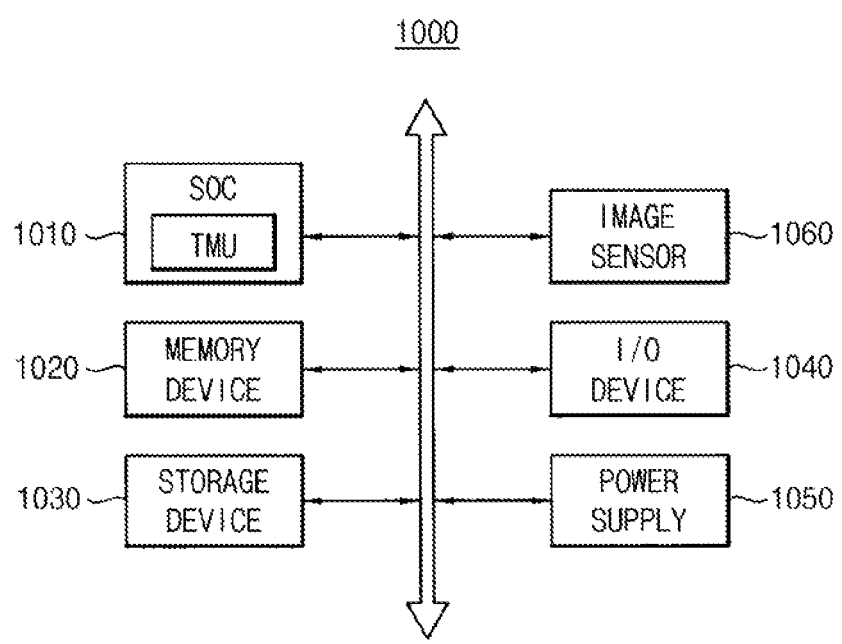
FIG. 30 is a block diagram illustrating a computing system including an SOC according to an exemplary embodiment.

FIG. 30 is a block diagram illustrating a computing system including an SOC according to an exemplary embodiment.

Referring to FIG. 30, a computing system 1000 may include an SOC 1010, a memory device 1020, a storage device 1030, an input/output (I/O) device 1040, a power supply 1050 and an image sensor 1060. Although it is not illustrated in FIG. 30, the computing system 1000 may further include ports that communicate with a video card, a sound card, a memory card, a USB device, or other electronic devices.

As described above, the SOC 1010 may include a temperature management circuit according to an exemplary embodiment, and the temperature management circuit may include a temperature management unit TMU, a main sensor (not shown) generating a digital signal and subsidiary sensors (not shown) generating pulse signals. The SOC 1010 may include a plurality of subsidiary blocks that function as heat sources in the SOC 1010, and at least one processor may be included in the subsidiary blocks. For example, the subsidiary blocks may include a core block including a central processing unit, a memory controller, a display controller block, a file system block, a graphic processing unit block, an image signal processing block, a multi-format codec block, and the like.

The SOC 1010 may communicate with the memory device 1020, the storage device 1030 and the input/output device 1040 via a bus such as an address bus, a control bus, and/or a data bus. In an exemplary embodiment, the SOC 1010 may be coupled to an extended bus, such as a peripheral component interconnection (PCI) bus.

The memory device 1020 may store data for operating the computing system 1000. In an exemplary embodiment, the memory device 1020 may be implemented with a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device. The storage device 1030 may include a solid state drive (SSD), a hard disk drive (HDD), a CD-ROM, etc. The input/output device 1040 may include an input device (e.g., a keyboard, a keypad, a mouse, etc.) and an output device (e.g., a printer, a display device, etc.). The power supply 1050 supplies operational voltages for the computing system 1000.

The image sensor 1060 may communicate with the SOC 1010 via the buses or other communication links. As described above, the image sensor 1060 may be integrated with the SOC 1010 in one chip, or the image sensor 1060 and the SOC 1010 may be implemented as separate chips.

The components in the computing system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The computing system 1000 may be any computing system including at least one SOC that requires the temperature management. For example, the computing system 1000 may include a digital camera, a mobile phone, a smart phone, a portable multimedia player (PMP), a personal digital assistant (PDA), etc.

FIG. 31 is a block diagram illustrating an interface employable in the computing system of FIG. 30.

Referring to FIG. 31, a computing system 1100 may be implemented by a data processing device that uses or supports a mobile industry processor interface (MIPI) interface. The computing system 1100 may include an SOC 1110 in a form of an application processor, an image sensor 1140, a display device 1150, and the like. The SOC may include a temperature management circuit according to an exemplary embodiment.

As described above, the SOC 1110 may include a temperature management unit TMU 100, a power management unit PMU 500, a main sensor (not shown) generating a digital signal and subsidiary sensors (not shown) generating pulse signals. A CSI host 1112 of the SOC 1110 may perform a serial communication with a CSI device 1141 of the image sensor 1140 via a camera serial interface (CSI). In some embodiments, the CSI host 1112 may include a deserializer (DES), and the CSI device 1141 may include a serializer (SER). A DSI host 1111 of the SOC 1110 may perform a serial communication with a DSI device 1151 of the display device 1150 via a display serial interface (DSI).

In an exemplary embodiment, the DSI host 1111 may include a serializer (SER), and the DSI device 1151 may include a deserializer (DES). The computing system 1100 may further include a radio frequency (RF) chip 1160 performing a communication with the SOC 1110. A physical layer (PHY) 1113 of the computing system 1100 and a physical layer (PHY) 1161 of the RF chip 1160 may perform data communications based upon a MIPI DigRF. The SOC 1110 may further include a DigRF MASTER 1114 that controls the data communications of the PHY 1161.

The computing system 1100 may further include a global positioning system (GPS) 1120, a storage 1170, a MIC 1180, a DRAM device 1185, and a speaker 1190. In addition, the computing system 1100 may perform communications using an ultra wideband (UWB) 1120, a wireless local area network (WLAN) 1220, a worldwide interoperability for microwave access (WIMAX) 1130, etc. However, the structure and the interface of the electric device 1000 are not limited thereto.

The foregoing is illustrative of exemplary embodiments and is not to be construed as limiting thereof. Although a few exemplary embodiments have been described, those skilled in the art will readily appreciate that many modifications are possible to the exemplary embodiments without materially departing from the novel teachings and advantages of the present inventive concept. Accordingly, all such exemplary embodiments, modifications thereto, and other exemplary embodiments, are intended to be included within the scope of the present inventive concept as defined in the following claims.

What is claimed is:

1. A method of managing temperature in a system on chip (SOC), comprising:
   generating a main temperature signal using a main sensor, the main temperature signal being a signal having a value corresponding to a main temperature of the SOC;
   generating subsidiary temperature signals using subsidiary sensors, the subsidiary temperature signals being pulse signals having frequencies corresponding to subsidiary temperatures of subsidiary blocks in the SOC, respectively;
   controlling an operation of the SOC based upon the main temperature signal and the subsidiary temperature signals, and
   latching the main temperature signal periodically to store a previous main temperature value and a current main temperature value; and counting pulses of the subsidiary temperature signals periodically to store current subsidiary temperature count values, wherein controlling the operation of the SOC includes:

generating, an interrupt signal based upon at least one temperature threshold value, the previous main temperature value and the current main temperature value; and controlling respective operational speeds of the subsidiary blocks based upon the interrupt signal and the current subsidiary temperature count values.

2. The method of claim 1, wherein controlling the respective operational speeds of the subsidiary blocks includes: varying at least one of power supply voltages and operational frequencies of the subsidiary blocks.

3. The method of claim 1, wherein controlling the respective operational speeds of the subsidiary blocks includes:

calculating a distribution value of the current subsidiary temperature count values in response to the interrupt signal; and controlling the respective operational speeds of the subsidiary blocks based upon the distribution value of the current subsidiary temperature count values.

4. The method of claim 1, wherein controlling the operation of the SOC further comprises:

comparing the current main temperature value and a maximum temperature threshold value; and blocking an external power supply voltage provided to the SOC when the current main temperature value is greater than the maximum temperature threshold value.

5. The method of claim 1, wherein controlling, the respective operational speeds of the subsidiary blocks includes:

comparing the current subsidiary temperature count values in response to the interrupt signal; and controlling the respective operational, speeds of the subsidiary blocks based upon the comparison result of the current subsidiary temperature count values.

6. The method of claim 5, wherein the operational speed of the subsidiary block corresponding to the higher current subsidiary temperature count value is decreased when the interrupt signal indicates an increase of the main temperature, and the operational speed of the subsidiary block corresponding to the lower current subsidiary temperature count value is increased when the interrupt signal indicates a decrease of the main temperature.

7. The method of claim 1, wherein generating the interrupt signal includes:

activating a temperature rising interrupt signal when the previous main temperature value is smaller than a temperature rising threshold value and the current main temperature value is greater than the temperature rising threshold value; and activating a temperature falling interrupt signal when the previous main temperature value is greater than a temperature falling threshold value and the current main temperature value is smaller than the temperature falling threshold value.

8. The method of claim 7, wherein the temperature falling threshold value is smaller than the temperature rising threshold value.

9. A method of managing temperature in a system on chip (SOC), comprising:

generating a main temperature signal using a main sensor, the main temperature signal being a signal having a value corresponding to a main temperature of the SOC;

generating subsidiary temperature signals using subsidiary sensors, the subsidiary temperature signals being pulse signals having frequencies corresponding to subsidiary temperatures of subsidiary blocks in the SOC, respectively;

controlling an operation of the SOC based upon the main temperature signal and the subsidiary temperature signals, latching the main temperature signal periodically to store a previous main temperature value and a current main temperature value; and counting pulses of the subsidiary temperature signals periodically to store current subsidiary temperature count values, counting cycles of a reference clock signal periodically to store a current reference count value, the reference clock signal having a reference frequency independent of temperature;

calculating current subsidiary temperature frequencies based upon the current subsidiary temperature count values, the current reference count value and the reference frequency, each of the current subsidiary temperature frequencies being proportional to each of the subsidiary temperatures; and calculating current subsidiary temperature values of the subsidiary blocks based upon the current subsidiary temperature frequencies.

10. A method of managing temperature in a system on chip (SOC), comprising:

generating a main temperature signal using a main sensor, the main temperature signal being a signal having a value corresponding to a main temperature of the SOC;

generating subsidiary temperature signals using subsidiary sensors, the subsidiary temperature signals being pulse signals having frequencies corresponding to subsidiary temperatures of subsidiary blocks in the SOC, respectively;

controlling an operation of the SOC based upon the main temperature signal and the subsidiary temperature signals, latching the main temperature signal periodically to store a previous main temperature value and a current main temperature value; and counting pulses of the subsidiary temperature signals periodically to store current subsidiary temperature count values, generating a reference pulse signal using an additional subsidiary sensor, the reference pulse signal having a frequency corresponding to the main temperature;

counting pulses of the reference pulse signal periodically to store a current reference count value; and calculating current subsidiary temperature values of the subsidiary blocks based upon the current subsidiary temperature count values, the current main temperature value and the current reference count value.

* * * * *